US008085953B2

(12) United States Patent
Nakanura et al.

(10) Patent No.: US 8,085,953 B2
(45) Date of Patent: Dec. 27, 2011

(54) AUDIO-SIGNAL TIME-AXIS EXPANSION/COMPRESSION METHOD AND DEVICE

(75) Inventors: Osamu Nakanura, Saitama (JP); Mototsugu Abe, Kanagawa (JP); Masayuki Nishiguchi, Kanagawa (JP)

(73) Assignee: Sony Corporation, Tokyo (JP)

( * ) Notice: Subject to any disclaimer, the term of this patent is extended or adjusted under 35 U.S.C. 154(b) by 1233 days.

(21) Appl. No.: 11/738,736

(22) Filed: Apr. 23, 2007

(65) Prior Publication Data

US 2007/0250324 A1 Oct. 25, 2007

(30) Foreign Application Priority Data

Apr. 24, 2006 (JP) ................................ 2006-119731

(51) Int. Cl.
*H03G 7/00* (2006.01)
*G10L 21/04* (2006.01)

(52) U.S. Cl. ....................................... 381/106; 704/503

(58) Field of Classification Search .................. 381/106, 381/107; 704/503, 211, 267; 84/604–606, 84/612
See application file for complete search history.

(56) References Cited

U.S. PATENT DOCUMENTS 5,611,018 A * 3/1997 Tanaka et al. ................. 704/215
5,873,059 A * 2/1999 Iijima et al. .................... 704/207
6,169,240 B1 * 1/2001 Suzuki ............................ 84/605
7,010,491 B1 * 3/2006 Kikumoto ..................... 704/503

FOREIGN PATENT DOCUMENTS

JP 04-289900 10/1992
JP 2004-354462 12/2004

OTHER PUBLICATIONS

Naotaka Morita et al., Time-Scale Expansion/Compression for Speech by Use of Pointer Interval Control Overlap and Add (PICOLA) and Its Evaluation, Accoustical Society of Japan Collected Papers, Oct. 1986, pp. 149-150.

Office Action received from the Japanese Patent Office in corresponding Japanese Patent Application No. 2006-119731, on May 31, 2011.

* cited by examiner

*Primary Examiner* — Xu Mei
(74) *Attorney, Agent, or Firm* — Finnegan, Henderson, Farabow, Garrett & Dunner, L.L.P.

(57) ABSTRACT

An audio-signal time-axis expansion/compression method for subjecting an audio signal to time-axis expansion/compression at a time domain includes the steps of: cross-fade-signal generating wherein a first period and a second period which are similar within the audio signal are employed to generate the cross-fade signal of the first period signal and the second period signal; correction-signal generating wherein the difference signal between the first period signal and the second period signal is subjected to time-axis reversal, and is multiplied with a window function to generate a correction signal; and connection-waveform generating wherein the cross-fade signal and the correction signal are added to generate a connection waveform for subjecting the audio signal to time-axis expansion/compression at the time domain.

18 Claims, 34 Drawing Sheets

AUDIO-SIGNAL TIME-AXIS EXPANSION/COMPRESSION METHOD AND DEVICE

CROSS REFERENCES TO RELATED APPLICATIONS

The present invention contains subject matter related to Japanese Patent Application JP 2006-119731 filed in the Japanese Patent Office on Apr. 24, 2006, the entire contents of which are Incorporated herein by reference.

BACKGROUND OF THE INVENTION

1. Field of the Invention

The present invention relates to an audio-signal time-axis expansion/compression method and device for changing the playback speed of music or the like.

2. Description of the Related Art

The PICOLA (Pointer Interval Control Overlap and Add) serving as a time-axis expansion/compression algorithm at a time domain corresponding to a digital speech signal has been known (see "Expansion/compression on the audio time-axis using the duplication adding method by pointer amount-of-movement control (PICOLA) and its evaluation", by Morita and Itakura, Acoustical Society of Japan collected papers, October 1986, pp 149-150). This algorithm has an advantage in that though its processing is simple and lightweight, good sound quality can be obtained as to a speech signal Description will be made briefly below regarding this PICOLA with reference to drawings. Let us say that with the present specification, the signals other than speech, which are included in music or the like, are referred to acoustic signals, and speech signals and acoustic signals are referred to audio signals in an integrated manner.

FIG. 22 illustrates an example wherein an original waveform is expanded with the PICOLA. First, periods A and B, which have a similar waveform, are found from an original waveform (a). The number of samples at the period A and the number of samples at the period B are the same. Subsequently, a waveform (b) which fades out at the period B is created. Similarly, a waveform (c) which fades in from the period A is created, and the waveform (b) and the waveform (c) are added, thereby obtaining an expanded waveform (d). Thus, adding of the waveform which fades out and the waveform which fades in is referred to as cross-fade. If we say that the cross-fade period between the period A and the period B is represented as a period A×B, the following operations result in a situation wherein the period A and the period B are changed into a period A, a period A×B, and a period B, which are expanded.

FIG. 23 is a schematic view illustrating a method for detecting a period length W between the period A and the period B which have a similar waveform. First, with a processing start position P0 as a starting point, the period A and period B of a sample j are determined such as shown in (a) in FIG. 23. While j is gradually expanded such as (a) in FIG. 23→(b) in FIG. 23→(c) in FIG. 23, the j that makes the periods A and B the most similar is obtained. As for a scale for measuring similarity, the following function D(j) can be employed, for example.

$$D(j)=(1/j)\Sigma\{x(i)-y(i)\}^2(i=0 \text{ through } j-1) \quad (1)$$

This D(j) is calculated in a range of WMIN≦j≦WMAX, and j is obtained so as to make the D(j) the minimum. The j at this time is the period length W of the period A and period B. Here, x(i) represents each of the sample values of the period A, and y(i) represents each of the sample values of the period B. Also, the WMAX and WMIN are values of 50 Hz through 250 Hz or so, and if a sampling frequency is 8 kHz, the WMAX is 160, and the WMIN is 32 or so. With the example in FIG. 23, j at (b) is selected as the j which makes the function D(j) the minimum.

FIG. 24 is a schematic view illustrating a method for expanding a waveform into an arbitrary length. First, as shown in FIG. 23, the j which makes the function D(j) the minimum is obtained with the processing start position P0 as a starting point, and W is substituted with j. Subsequently, as shown in FIG. 24, a period 2401 is copied to a period 2403, and the cross-fade waveform of the period 2401 and a period 2402 is created at a period 2404. Subsequently, the remaining period obtained by subtracting the period 2401 from a position P0 through a position P0' of an original waveform (a) is copied to an expanded waveform (b). According to the above-described operation, L samples from the position P0 through position P0' of the original waveform (a) become W+L samples at the expanded waveform (b), and the number of samples becomes r times.

$$r=(W+L)/L(1.0<r\leqq 2.0) \quad (2)$$

Rewriting this expression regarding L yields Expression (3), and in the event of attempting to multiply the number of samples of the original waveform (a) by r times, it can be found that the position P0' is determined such as shown in Expression (4).

$$L=W\cdot 1/(r-1) \quad (3)$$

$$P0'=P0+L \quad (4)$$

Further, defining 1/r such as shown in Expression (5) yields Expression (6).

$$R=1/r(0.5\leqq R<1.0) \quad (5)$$

$$L=W\cdot R/(1-R) \quad (6)$$

Thus, R is employed, whereby an expression such that the original waveform (a) is played by R-times speed can be employed. Let us say below that this R is referred to as a speech rate conversion rate. Note that with the example in FIG. 24, the number of samples L is around 2.5 W, which is equivalent to slow playback of around 0.7-times speed.

Upon the processing of the position P0 through the position P0' of the original waveform (a) being completed, the position P0' is substituted with a position P1 to be newly regarded as the starting point of the processing, and the same processing is repeated.

Subsequently, description will be made regarding time-axis compression of an original waveform. FIG. 25 illustrates an example wherein an original waveform is compressed with PICOLA. First, periods A and B which have a similar waveform are found from the original waveform (a). The number of samples at the period A and the number of samples at the period B are the same. Subsequently, a waveform (b) which fades out at the period A is created. Similarly, a waveform (c) which fades in from the period B is created, and the waveform (b) and the waveform (c) are added, whereby a compressed waveform (d) can be obtained. The period A and period B are changed into a period A×B by performing the above-described operation.

FIG. 26 illustrates a method for compressing a waveform into an arbitrary length. First, as shown in FIG. 23, with the processing start position P0 as a starting point, j is obtained so as to make the function D(j) the minimum, and W is substituted with j. Subsequently, as shown in FIG. 26, the cross-fade waveform of a period 2601 and a period 2602 is created at a period 2603. Subsequently, the remaining period obtained by subtracting the period 2601 and period 2602 from a position P0 through a position P0' of an original waveform (a) is copied to a compressed waveform (b) According to the above-described operations, W+L samples from the position P0 through position P0' of the original waveform (a) become L samples at the compressed waveform (b), and the number of samples becomes r times.

$$r=L/(W+L)(0.5\leqq r<1.0) \quad (7)$$

Rewriting this Expression (7) regarding L yields Expression (8), and in the event of multiplying the number of samples of the original waveform (a) by r times, it can be found that the position P0' is determined such as shown in Expression (9).

$$L=W\cdot r/(1-r) \quad (8)$$

$$P0'=P0+(W+L) \quad (9)$$

Further, if 1/r is defined such as shown in Expression (10), Expression (11) is obtained.

$$R=1/r(1.0<R\leqq 2.0) \quad (10)$$

$$L=W\cdot 1/(R-1) \quad (11)$$

Thus, R is employed, whereby an expression such that the original waveform (a) is played by R-times speed can be made. Upon the processing of the position P0 through the position P0' of the original waveform (a) being completed, the position P0' is substituted with a position P1 to be newly regarded as the starting point of the processing, and the same processing is repeated.

With the example in FIG. 26, the number of samples L is around 1.5 W, which is equivalent to slow playback of around 1.7-times speed.

FIG. 27 is a flowchart illustrating the flow of waveform time-axis expansion processing of PICOLA. In step S1001, determination is made regarding whether or not there is any audio signal to be processed in the input buffer, and in the event that there is no audio signal, the processing ends. In the event that there is an audio signal to be processed, the flow proceeds to step S1002, j which makes the function D(j) the minimum is obtained with the processing start position P as a starting point, and W is substituted with j. In step S1003, L is obtained from the speech rate conversion rate R specified by a user, and in step S1004, the period A equivalent to the W samples from the processing start position P is output to the output buffer. In step S1005, the period A equivalent to the W samples from the processing start position P and the period B equivalent to the next W samples are obtained, which is referred to as a period C, and in step S1006, this period C is output to the output buffer. In step S1007, the L−W samples from the position P+W of the input buffer are output (copied) to the output buffer. In step S1008, the processing start position P is moved to the P+L, and the flow returns to step S1001, where the processing is repeatedly performed.

FIG. 28 is a flowchart illustrating the flow of waveform time-axis compression processing of PICOLA. In step S5101, determination is made regarding whether or not there is any audio signal to be processed in the input buffer, and in the event that there is no audio signal, the processing ends. In the event that there is an audio signal to be processed, the flow proceeds to step S1102, j which makes the function D(j) the minimum is obtained with the processing start position P as a starting point, and W is substituted with j. In step S1103, L is obtained from the speech rate conversion rate R specified by a user, and in step S1104, the cross-fade of the period A equivalent to the W samples from the processing start position P, and the period B equivalent to the next W samples is obtained, which is referred to as a period C, and in step S1105, this period C is output to the output buffer. In step S1106, the L−W samples from the position P+2W of the input buffer are output (copied) to the output buffer. In step S1107, the processing start position P is moved to the P+(W+L), and the flow returns to step S1101, where the processing is repeatedly performed.

FIG. 29 is one example of the configuration of a speech rate conversion device 100 according to PICOLA. An audio signal to be processed is first subjected to buffering in an input buffer 101. A similar-waveform-length extracting unit 102 obtains j which makes the function D(j) the minimum, and substitutes W with j. The W obtained by the similar-waveform-length extracting unit 102 is passed to the input buffer 101, and is employed for buffer operations. The similar-waveform-length extracting unit 102 passes 2 W samples serving as audio signals to a connection-waveform generating unit 103. The connection-waveform generating unit 103 cross-fades the 2 W samples serving as audio signals into the W samples. The audio signals are transmitted from the input buffer 101 and the connection-waveform generating unit 103 to the output buffer 104 in accordance with the speech rate conversion rate R. The audio signal generated at the output buffer 104 is output from the speech conversion device as an output audio signal.

FIG. 30 is a flowchart illustrating the flow of the processing in the connection-waveform generating unit 103 in the configuration example in FIG. 29. In the case of time-axis expansion, let us say that each of the sample values of the period A is x(i) (i=0, 1, and so on through W−1), and each of the sample values of the period B is y(i) (i=0, 1, and so on through W−1), and in the case of time-axis compression, let us say that each of the sample values of the period B is x(i) (i=0, 1, and so on through W−1), and each of the sample values of the period A is y(i) (i=0, 1, and so on through W−1). Also, let us say that each of the sample values after cross-fade is z(i) (i=0, 1, and so on through W−1).

In step S1201, the index i is reset to zero. In step S1202, determination is made regarding whether or not the index i is smaller than W, and in the case of being smaller than W, the flow proceeds to step S1203, and in the case of not smaller than W, the processing ends. In step S1203, weight h=i/W is obtained, and in step 51204, a cross-fade signal Z(i) is calculated.

$$z(i)=hx(i)+(1-h)y(i) \quad (12)$$

In step S1205, following the index i being incremented by one, the flow returns to step S1202, where the processing is repeatedly performed. According to the above-described processing, the cross-fade values of the x(i) and y(i) are stored in the z(i).

As described above, as described with reference to FIGS. 22 through 30, an audio signal can be expanded/compressed with an arbitrary speech rate conversion rate R (0.5≦R<1.0, 1.0<R≦2.0) using the speech rate conversion algorithm PICOLA.

SUMMARY OF THE INVENTION

However, with the existing PICOLA, though excellent sound quality can be obtained as to a speech signal, it is difficult to obtain excellent sound quality as to an acoustic signal such as music or the like, which causes a problem in some cases. This is because generally music includes the sound of various types of musical instruments, and accordingly, waveforms having various types of frequency are overlapped on an acoustic signal.

FIG. 31 illustrates the states of waveforms in the case of obtaining an expanded waveform (b) by expanding a waveform (a) of periods A and B, wherein solid-line waveforms of the periods A and B in the (a) have the same phase. Also, FIG. 31 illustrates a situation in which a waveform having small amplitude shown in the solid line is overlapped on the waveform shown in a dotted line. In the event of expanding the original waveform (a) 1.5 times, a period A (3101) of the original waveform (a) is copied to a period A (3103) of the expanded waveform (b), the cross-fade waveform of the period A (3101) and a period B (3102) of the original waveform (a) is generated at a period A×B (3104) of the expanded waveform (b), and finally, the period B (3102) of the original waveform (a) is copied to a period B (3105) of the expanded waveform (b). In this case, an envelope in a solid line waveform of the expanded waveform (b) is schematically represented such as shown in (c) in the drawing.

Similarly, FIG. 32 illustrates the states of waveforms in the case of obtaining an expanded waveform (b) by expanding a waveform (a) of periods A and B, wherein solid-line waveforms of periods A and B in the (a) have an inverse phase. In the event of expanding the original waveform (a) 1.5 times, a period A (3201) of the original waveform (a) is copied to a period A (3203) of the expanded waveform (b), the cross-fade waveform of the period A (3201) and a period B (3202) of the original waveform (a) is generated at a period A×B (3204) of the expanded waveform (b), and finally, the period B (3202) of the original waveform (a) is copied to a period B (3205) of the expanded waveform (b). In this case, an envelope in a solid line waveform of the expanded waveform (b) is schematically represented such as shown in (c) in the drawing.

As can be readily understood when comparing FIG. 31 with FIG. 32, with the waveform after cross-fade, the amplitude is greatly changed depending on the correlation between the two waveforms before cross-fade. That is to say, allophone occurs. Note that it is difficult to consider that the waveform such as shown in the solid-line waveform in (a) in FIG. 32 is included in a common acoustic signal, but a case actually frequently occurs wherein a waveform which is similar to an inverse phase is included in the selected period A and period B.

Also, FIG. 33 illustrates an example wherein the contents described with FIGS. 31 and 32 are applied to a little longer waveform. In the event of classifying the original waveform in (a) in FIG. 33 into five periods of A1, A2, A3, A4, and A5, when having the same phase relation, the respective periods become a waveform such as shown in (b) in FIG. 33, when having an inverse-phase relation, the respective periods become a waveform such as shown in (c) in FIG. 33, and when having a no-phase relation, the respective periods become a waveform such as shown in (d) in FIG. 33. When having an inverse-phase relation or no-phase relation, surge-like allophone becomes pronounced.

FIG. 34 is a specific example in the case of no phase, and in the event of classifying the original waveform in (a) in FIG. 34 serving as white noise into five periods A1, A2, A3, A4, and A5, the expanded waveform thereof becomes such as shown in (b) in FIG. 34. That is to say, the expanded waveform becomes such as the schematic view of (d) in FIG. 33, surge-like allophone, which does not exist in the original waveform, occurs in a waveform. With an actual acoustic signal, though surge-like allophone is not extreme so far, as a result of the components of the sound contained in a moment receiving such influence, surge-like allophone is confirmed aurally.

Thus, with the existing PICOLA, surge-like allophone, which does not exist in an original waveform, is apt to occur, which is annoying. Also, the amplitude of the waveform subjected to time-axis expansion/compression processing is apt to become small on average.

The present invention has been made in light of these problems. It has been found desirable to provide an audio-signal time-axis expansion/compression method and device capable of obtaining excellent sound quality.

According to an embodiment of the present invention, there is provided an audio-signal time-axis expansion/compression method for subjecting an audio signal to time-axis expansion/compression at a time domain, including the steps of: cross-fade-signal generating wherein a first period and a second period which are similar within the audio signal are employed to generate the cross-fade signal of the first period signal and the second period signal; correction-signal generating wherein the difference signal between the first period signal and the second period signal is subjected to time-axis reversal, and is multiplied with a window function to generate a correction signal; and connection-waveform generating wherein the cross-fade signal and the correction signal are added to generate a connection waveform for subjecting the audio signal to time-axis expansion/compression at the time domain.

Also, according to an embodiment of the present invention, there is provided an audio-signal time-axis expansion/compression device for subjecting an audio signal to time-axis expansion/compression at a time domain, including: cross-fade signal generating means wherein a first period and a second period which are similar within the audio signal are employed to generate the cross-fade signal of the first period signal and the second period signal; correction signal generating means wherein the difference signal between the first period signal and the second period signal is subjected to time-axis reversal, and is multiplied with a window function to generate a correction signal; and connection-waveform generating means wherein the cross-fade signal and the correction signal are added to generate a connection waveform for subjecting the audio signal to time-axis expansion/compression at the time domain.

Also, according to an embodiment of the present invention, there is provided an audio-signal time-axis expansion/compression method for subjecting an audio signal to time-axis expansion/compression at a time domain, including the steps of: sum-signal generating wherein a first period and a second period which are similar within the audio signal are employed to generate the sum signal of the first period signal and the second period signal; correction-signal generating wherein the difference signal between the first period signal and the second period signal is subjected to time-axis reversal to generate a correction signal; adding wherein the sum signal and the correction signal are added; and connection-waveform generating wherein the signal added at the adding is cross-faded with the first period signal and the second period signal to generate a connection waveform.

Also, according to an embodiment of the present invention, there is provided an audio-signal time-axis expansion/compression device for subjecting an audio signal to time-axis expansion/compression at a time domain, including: sum signal generating means wherein a first period and a second period which are similar within the audio signal are employed to generate the sum signal of the first period signal and the second period signal; correction signal generating means wherein the difference signal between the first period signal and the second period signal is subjected to time-axis reversal to generate a correction signal; adding means wherein the sum signal and the correction signal are added; and connection-waveform generating means wherein the signal added by the adding means is cross-faded with the first period signal and the second period signal to generate a connection waveform for subjecting the audio signal to time-axis expansion/compression at the time domain.

According to an embodiment of the present invention, employing a first period and a second period which are continuous and similar within an audio signal, and generating a cross-fade signal by using a correction signal wherein the difference signal between a first period signal and a second period signal is subjected to time-axis reversal, whereby surge-like allophone can be reduced.

DESCRIPTION OF THE PREFERRED EMBODIMENTS

Description will be made in detail below regarding specific embodiments of the present invention with reference to the drawings.

First Embodiment

Figure 1:
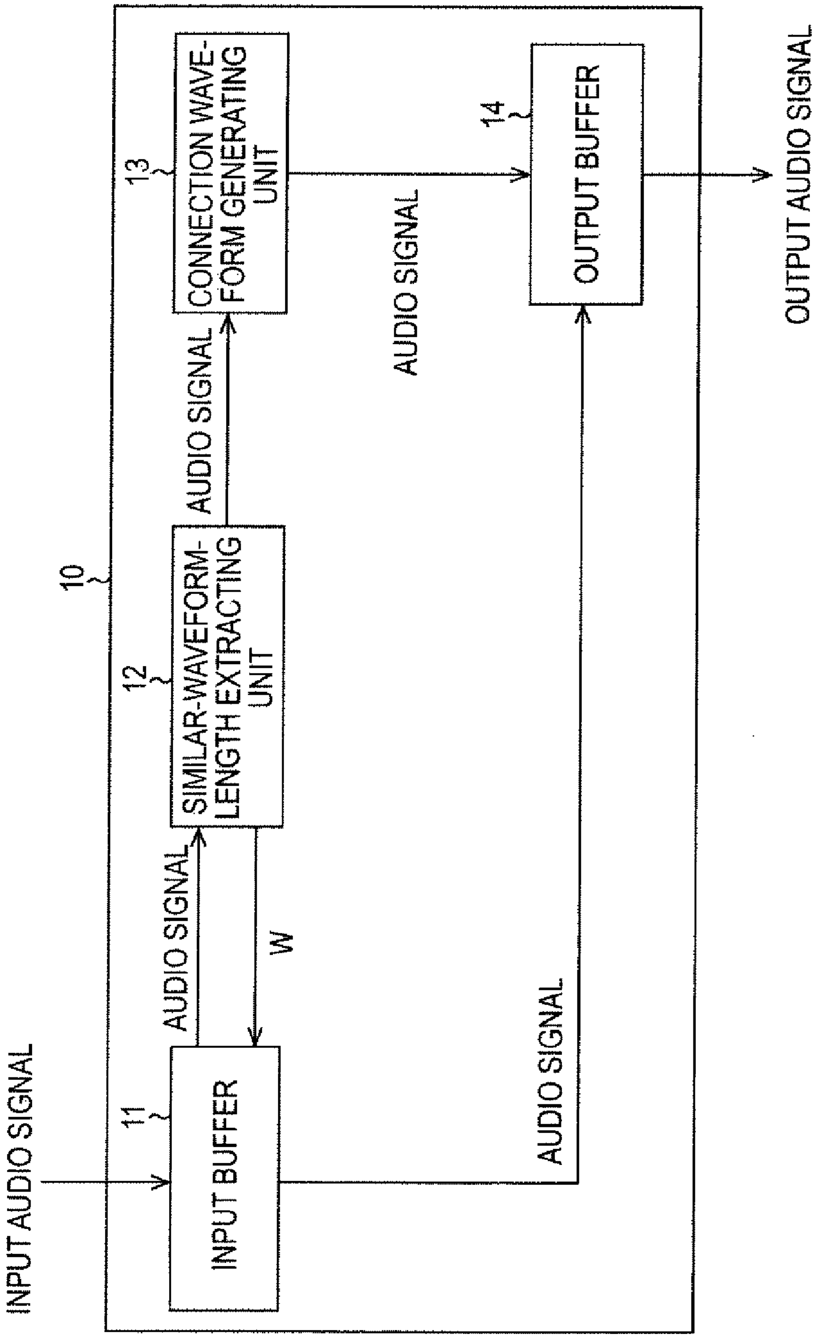
FIG. 1 is a block diagram illustrating the configuration of an audio-signal time-axis expansion/compression device according to a first embodiment of the present invention.

FIG. 1 is a block diagram illustrating the configuration of an audio-signal time-axis expansion/compression device according to a first embodiment of the present invention.

An audio-signal time-axis expansion/compression device 10 is configured with an input buffer 11 for subjecting an input audio signal to buffering, a similar-waveform-length extracting unit 12 for extracting a continuous similar waveform length (equivalent to 2 W samples) from the audio signal of the input buffer 11, a connection-waveform generating unit 13 for subjecting the audio signals of 2 W samples to cross-fade to generate the connection waveforms of W samples, and an output buffer 14 for outputting an output signal made up of the input audio signal input in accordance with a speech rate conversion rate R, and a connection waveform. An input audio signal to be processed is subjected to buffering to the input buffer 11.

Figure 2:
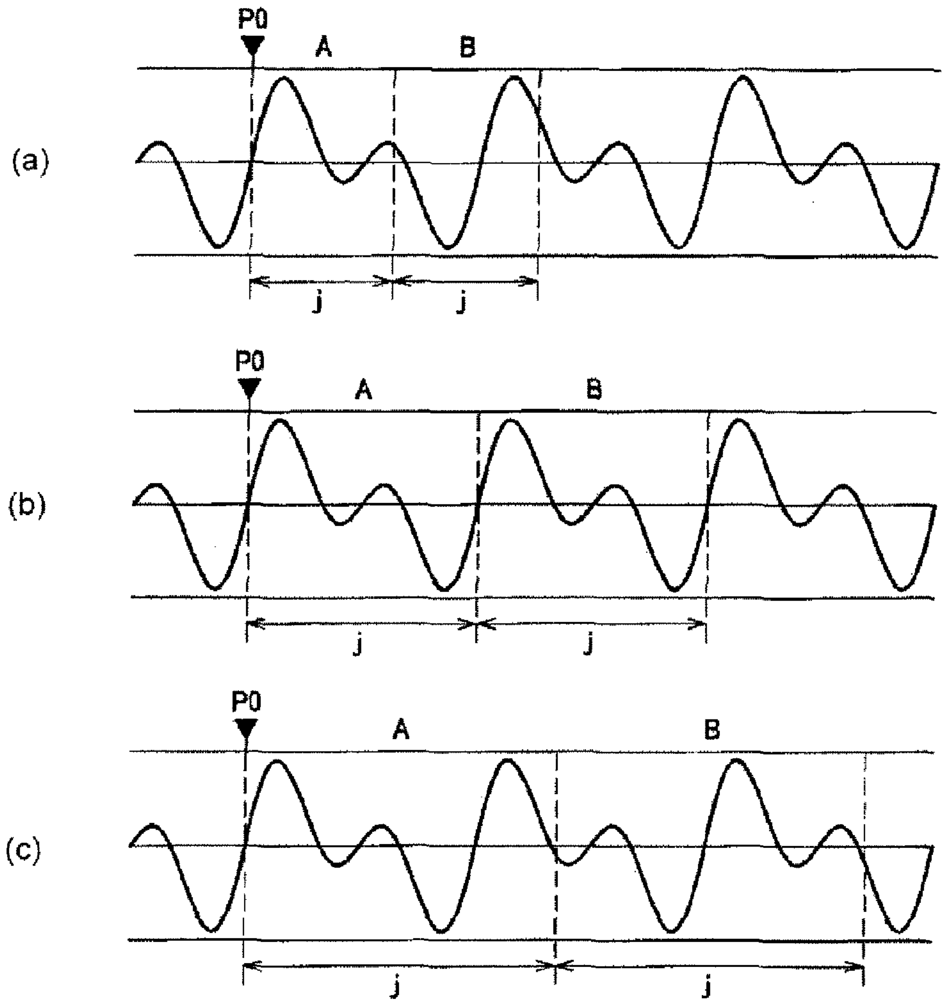
FIG. 2 is a diagram schematically illustrating a similar-waveform-length extracting processing.

The similar-waveform-length extracting unit 12 determines periods A and B of j samples with a processing start position P0 as a starting point such as shown in (a) in FIG. 2 as to the audio signal subjected to buffering to the input buffer 11, as shown in FIG. 2. The similar-waveform-length extracting unit 12 obtains j wherein the period A and the period B are the most similar while gradually expanding j such as (a) in FIG. 2→(b) in FIG. 2→(c) in FIG. 2. As for a scale for measuring similarity, the following function D(j) can be employed, for example.

$$D(j)=(1/j)\Sigma\{x(i)-y(i)\}^2(i=0 \text{ through } j-1) \quad (13)$$

This D(j) is calculated in a range of WMIN≦j≦WMAX, and a j that minimizes D(j) is obtained. The j at this time is the period length W of the period A and period B. Here, x(i) represents each of the sample values of the period A, and y(i) represents each of the sample values of the period B. Also, the WMAX and WMIN are, for example, values of 50 Hz through 250 Hz or so, and if a sampling frequency is 8 kHz, the WMAX is 160, and the WMIN is 32 or so. With the example in FIG. 2, j at (b) is selected as the j which makes the function D(j) the minimum.

The W obtained by the similar-waveform-length extracting unit 12 is passed to the input buffer 11, and is employed for buffer operations. The similar-waveform-length extracting unit 12 outputs 2 W samples serving as audio signals to the connection-waveform generating unit 13. The connection-waveform generating unit 13 cross-fades the 2 W samples serving as audio signals into the W samples. The input buffer 11 and the connection-waveform generating unit 13 output the audio signals to the output buffer 14 in accordance with the speech rate conversion rate R. The audio signal subjected to buffering to the output buffer 14 is output from the audio-signal time-axis expansion/compression device 10 as an output audio signal.

Figure 3:
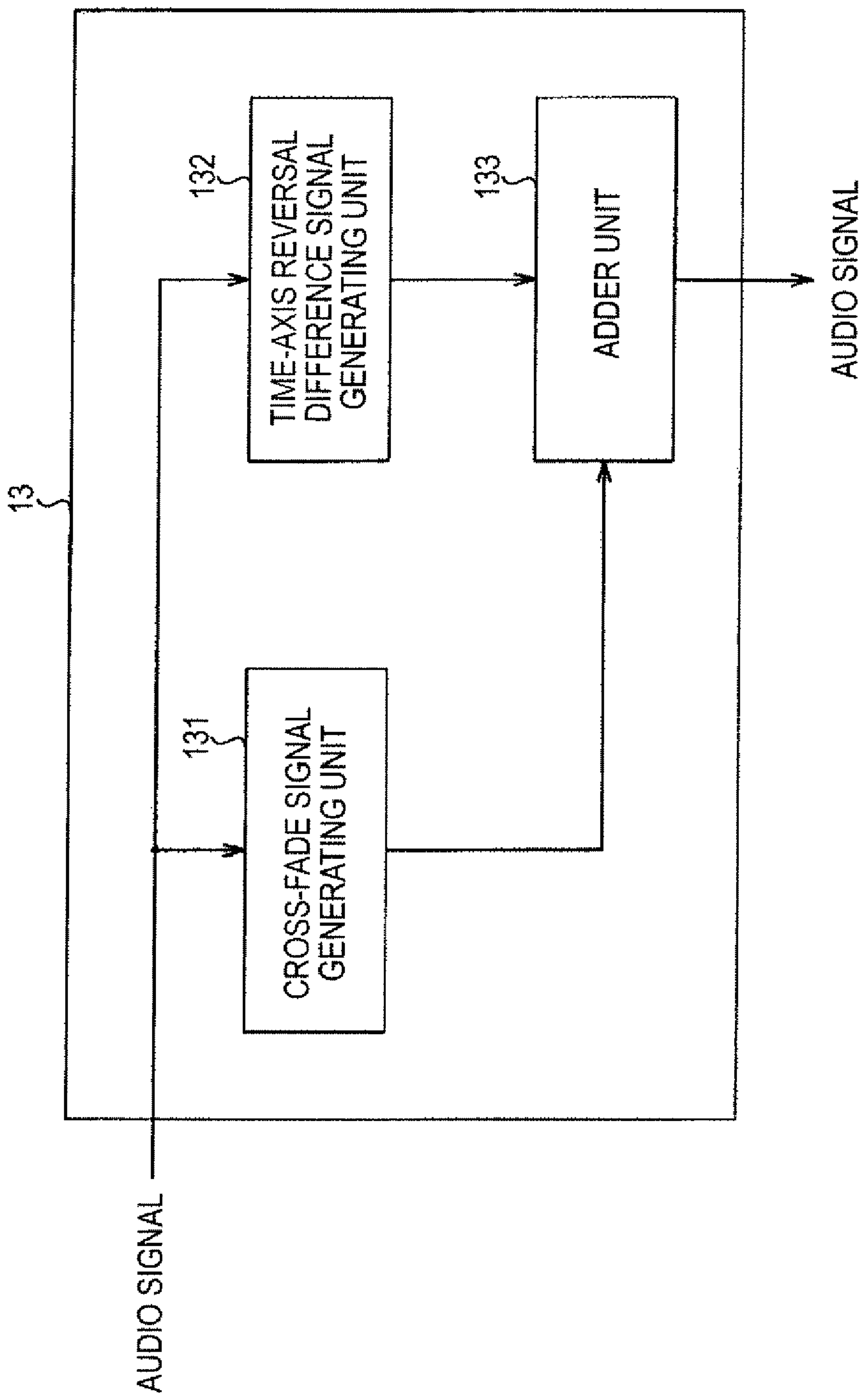
FIG. 3 is a block diagram illustrating the configuration of a connection-waveform generating unit 13 according to the first embodiment.

FIG. 3 is a block diagram illustrating the configuration of the connection-waveform generating unit 13 according to the first embodiment. The connection-waveform generating unit 13 includes a cross-fade signal generating unit 131 for generating a cross-fade signal from an audio signal, a time-axis reversal difference signal generating unit 132 for generating a difference signal from an audio signal, and generating a time-axis reversal difference signal wherein the time-axis of the difference signal thereof is reversed, and an adder unit 133 for adding a time-axis reversal difference signal to a cross-fade signal.

Upon an audio signal for generating a connection waveform being input, the cross-fade signal generating unit 131 generates a cross-fade signal from the audio signal. At the same time, the time-axis reversal difference signal generating unit 132 generates a difference signal from the audio signal, reverses the time axis of the difference signal thereof, and multiplies this by a window function to generate a time-axis reversal difference signal. The adder unit 133 adds the time-axis reversal difference signal generated at the time-axis reversal difference signal generating unit 132 to the cross-fade signal generated at the cross-fade signal generating unit 131, and regards the audio signal serving as a result thereof as the output of the connection-waveform generating unit 13.

Figure 4:
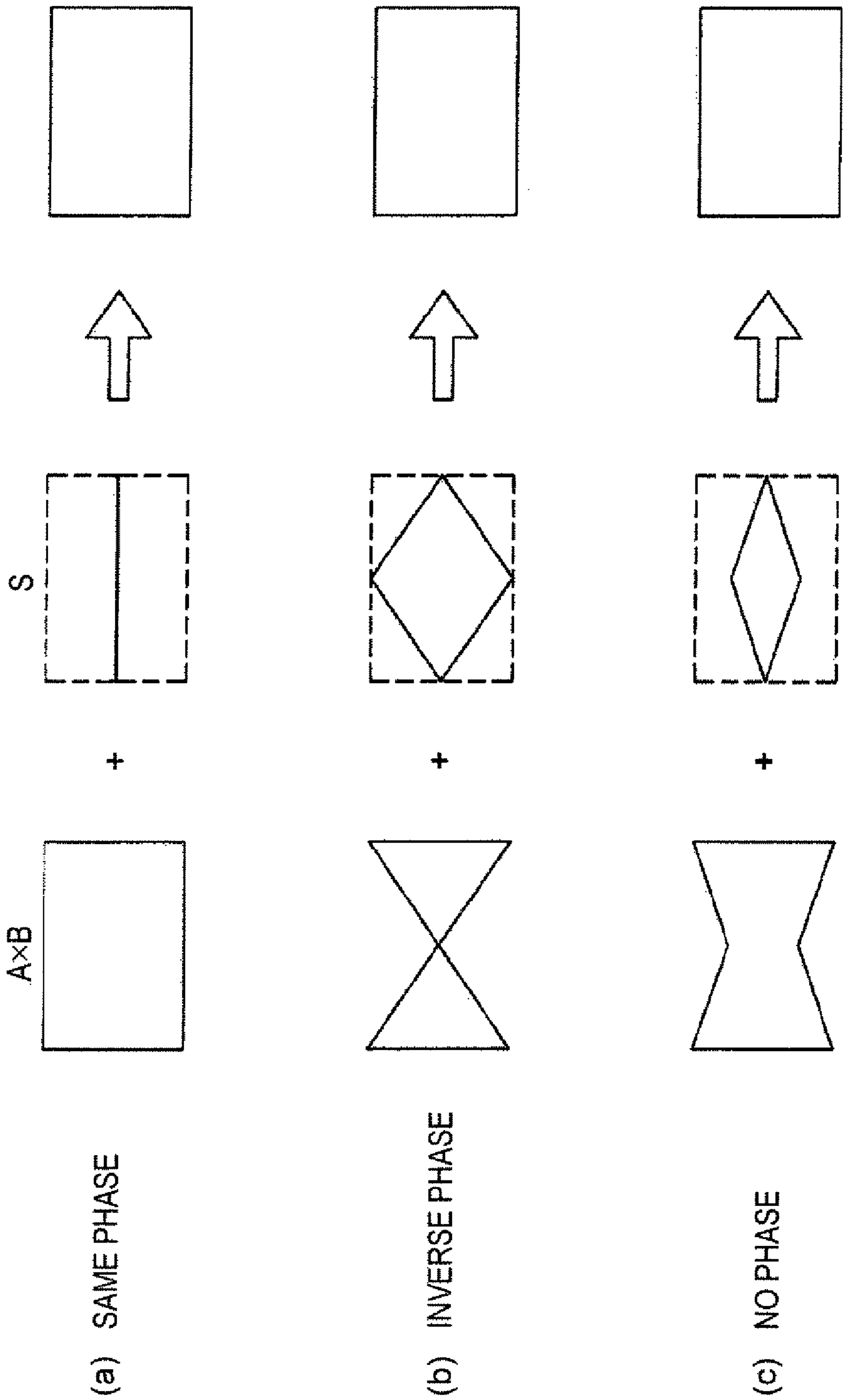
FIG. 4 is a diagram schematically illustrating signal processing of the connection-waveform generating unit.

Subsequently, description will be made regarding signal processing of the connection-waveform generating unit 13. FIG. 4 schematically illustrates the signal processing of the connection-waveform generating unit 13. A cross-fade waveform A×B generated at the cross-fade signal generating unit 131 is corrected with the time-axis reversal difference signal serving as the correction signal generated at the time-axis reversal difference signal generating unit 132.

Now, (a) in FIG. 4 is a case of the cross-fade waveform of waveforms having the same phase, which needs no correction, and (b) in FIG. 4 is a case of the cross-fade waveform of waveforms having an inverse phase, and if a correction signal S such as shown in FIG. 4 is applied to, the amplitude of the waveform before cross-fade is retained. Also, (c) in FIG. 4 is in the case of the cross-fade waveform of waveforms having no phase, and if the correction signal S is applied to, the amplitude of the waveform before cross-fade is retained. With a specific example of the present invention, performing this correction enables the problem to be solved.

The connection-waveform generating unit 13 inputs a signal x(i) (i=0, 1, 2, and so on through W−1) and a signal y(i) (i=0, 1, 2, and so on through W−1) of two periods before cross-fade to generate a correction signal S. If we say that the correction signal S is s(i) (i=0, 1, 2, and so on through W−1), the correction signal S can be determined such as shown in Expression (14).

$$s(i)=\Delta\{(x(W-1-i)-y(W-1-i))/2\} \quad (14)$$

Figure 5:
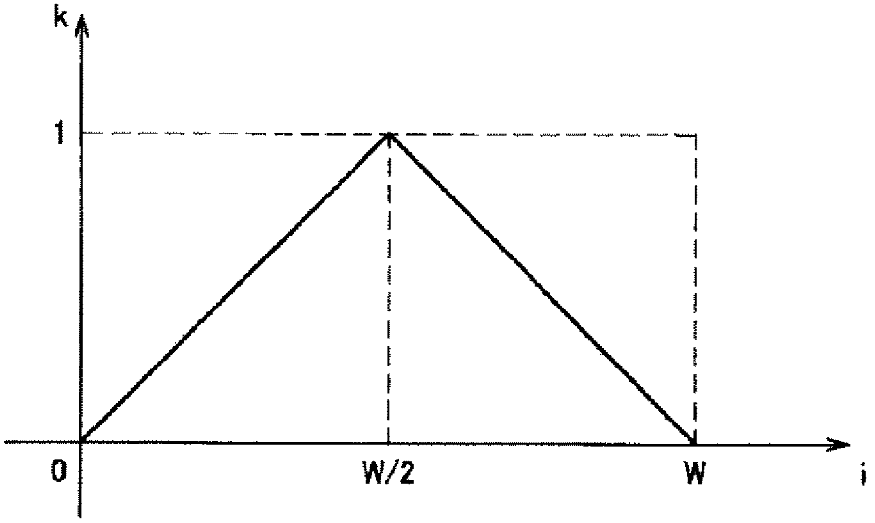
FIG. 5 is a diagram illustrating one example of a window function employed for generating a correction signal S.
Figure 6:
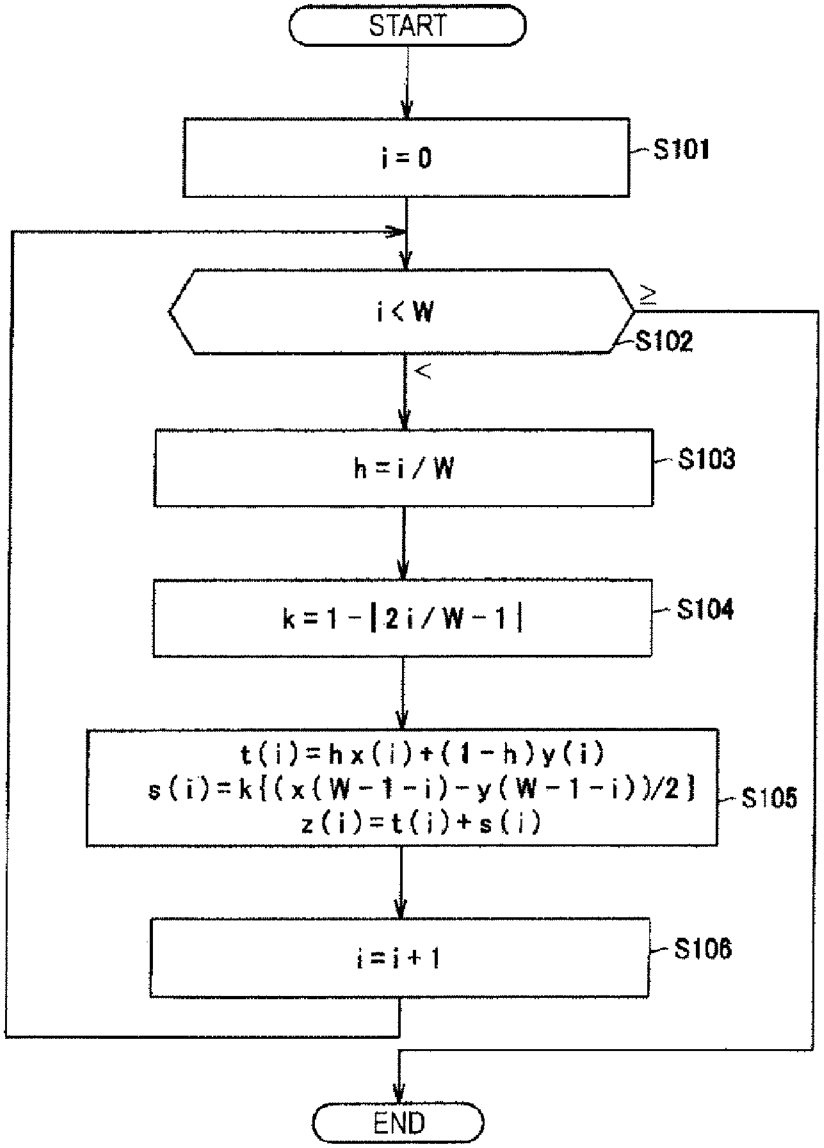
FIG. 6 Is a flowchart illustrating connection-waveform generating processing at the time of employing the window function shown in FIG. 5.

Here, Δ is a window function such as described later. With this Expression (14), the difference of the waveforms of the two periods before cross-fade is obtained, divided by two, the time axis thereof is reversed, and is multiplied by the window function. In the event of the waveforms of the two periods before cross-fade having the same phase, the amplitude of the difference signal of the signal before cross-fade is a small grade, and in the event of the waveforms of the two periods before cross-fade having an inverse phase, the amplitude of the difference signal thereof is a great grade, and in the event of the waveforms of the two periods before cross-fade having no phase, the amplitude of the difference signal thereof is a middle grade or so, and as shown in FIG. 4, the attenuation of the amplitude of the waveform of the cross-fade period can be supplemented, FIG. 5 is one example of the window function employed at the time of generating the correction signal S. Description will be made regarding a signal processing method employing this window function with reference to the flowchart shown in FIG. 6. Note that the meanings of W, x(i), y(i), z(i), and so forth, are the same as those in the previous drawings.

In step S101, the index i is reset to zero. In step S102, determination is made regarding whether or not the index i is smaller than W, and in the case of being smaller than W, the flow proceeds to step S103, and in the case of not being smaller than W, the processing ends.

In step S103, the weight h is obtained, and in step S104 the window function k shown in FIG. 5 is obtained.

$$k=1-|2i/W-1| \quad (15)$$

In step S105, the cross-fade signal generating unit 131 generates a cross-fade signal t(i) from the respective sample values x(i) and y(i), and at the same time, the time-axis reversal difference signal generating unit 132 generates a correction signal s(i) from the above-described Expression (14). Subsequently, the adder unit 133 generates a cross-fade signal z(i) serving as a connection waveform from those t(i) and s(i). In step S106, the index i is incremented by one, following which the flow returns to step S102, where the above-described processing is repeatedly performed.

Thus, the cross-fade signal t(i) is corrected with the correction signal s(i) to generate a connection waveform, whereby excellent speech rate conversion close to the original sound can be realized with not only a speech signal but also an acoustic signal.

Figure 7:
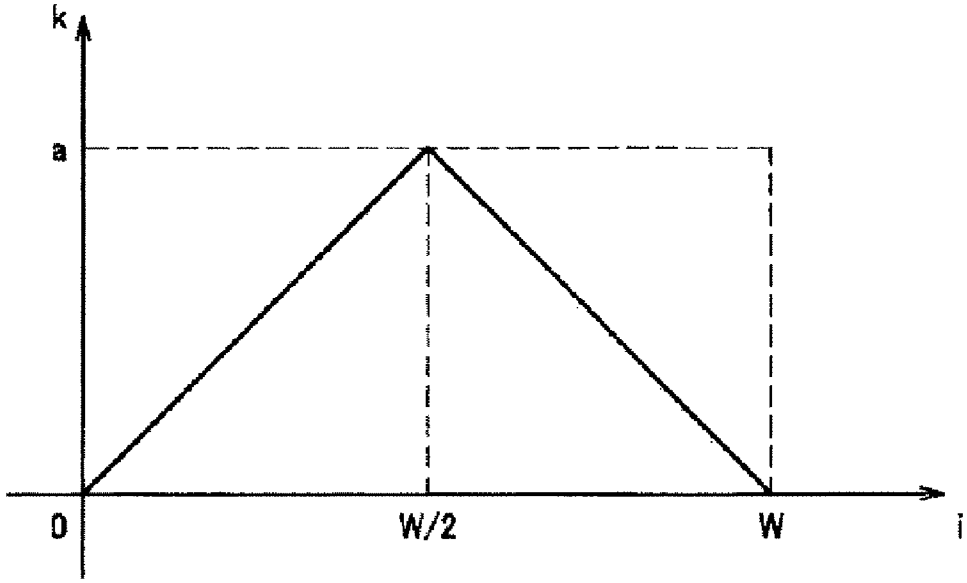
FIG. 7 is a diagram illustrating one example of the window function employed for generating the correction signal S.
Figure 8:
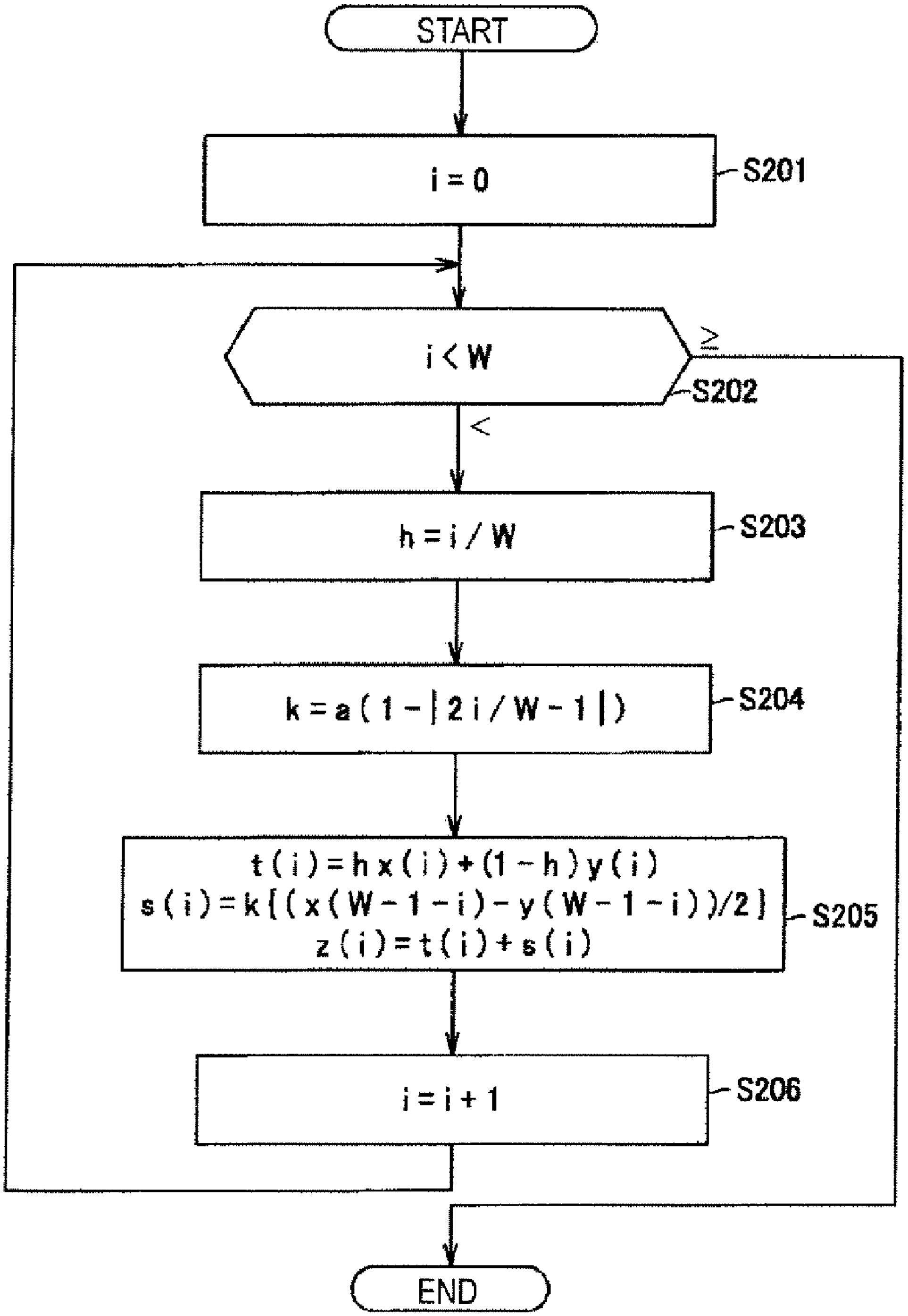
FIG. 8 is a flowchart illustrating connection-waveform generating processing at the time of employing the window function shown in FIG. 7.

Also, FIG. 7 is another example of the window function employed at the time of generating the correction signal S. With the window function shown in FIG. 5, it is difficult to determine the strength of the correction signal S without any restriction, so there is no flexibility such as weakening the strength thereof in the case of an audio signal, strengthening the strength thereof in the case of an acoustic signal, customizing according to the preference of a user or the type of sound source, and so forth. Consequently, an arrangement has been made wherein the strength of the correction signal S can be set without any restriction using the window function shown in FIG, 7. FIG. 8 is a flowchart for describing the signal processing employing the window function shown in FIG. 7.

In step S201, the index i is reset to zero. In step S202, determination is made regarding whether or not the index is smaller than W, and in the case of being smaller than W, the flow proceeds to step S203, and in the case of not being smaller than W, the processing ends.

In step S203, weight h is obtained, and in step S204 the window function k shown in FIG. 7 is obtained.

$$k=a(1-|2i/W-1|) \tag{16}$$

Here, the coefficient a represents the strength of the correction signal determined by the user. For example, in the case of the a having a value close to zero, the strength of the correction signal is weak.

In step S205, the cross-fade signal generating unit 131 generates a cross-fade signal t(i) from the respective sample values x(i) and y(i), and at the same time, the time-axis reversal difference signal generating unit 132 generates a correction signal s(i) from the above-described Expression (14). Subsequently, the adder unit 133 generates a cross-fade signal z(i) serving as a connection waveform from those t(i) and s(i). In step S206, the index i is incremented by one, following which the flow returns to step S202, where the above-described processing is repeatedly performed. According to such processing, flexibility such as customizing according to the preference of a user or the type of sound source can be obtained.

Figure 9:
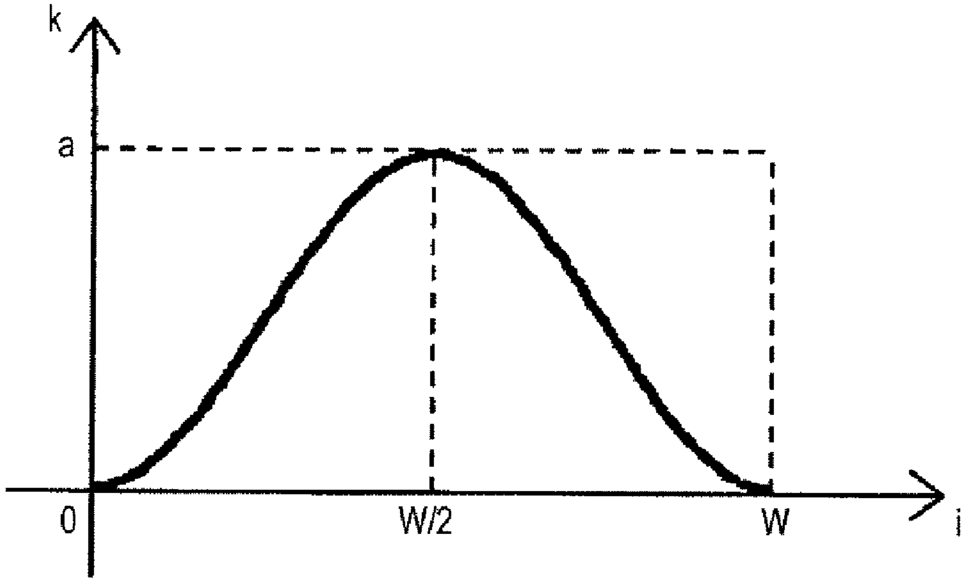
FIG. 9 is a diagram illustrating one example of the window function employed for generating the correction signal S.
Figure 10:
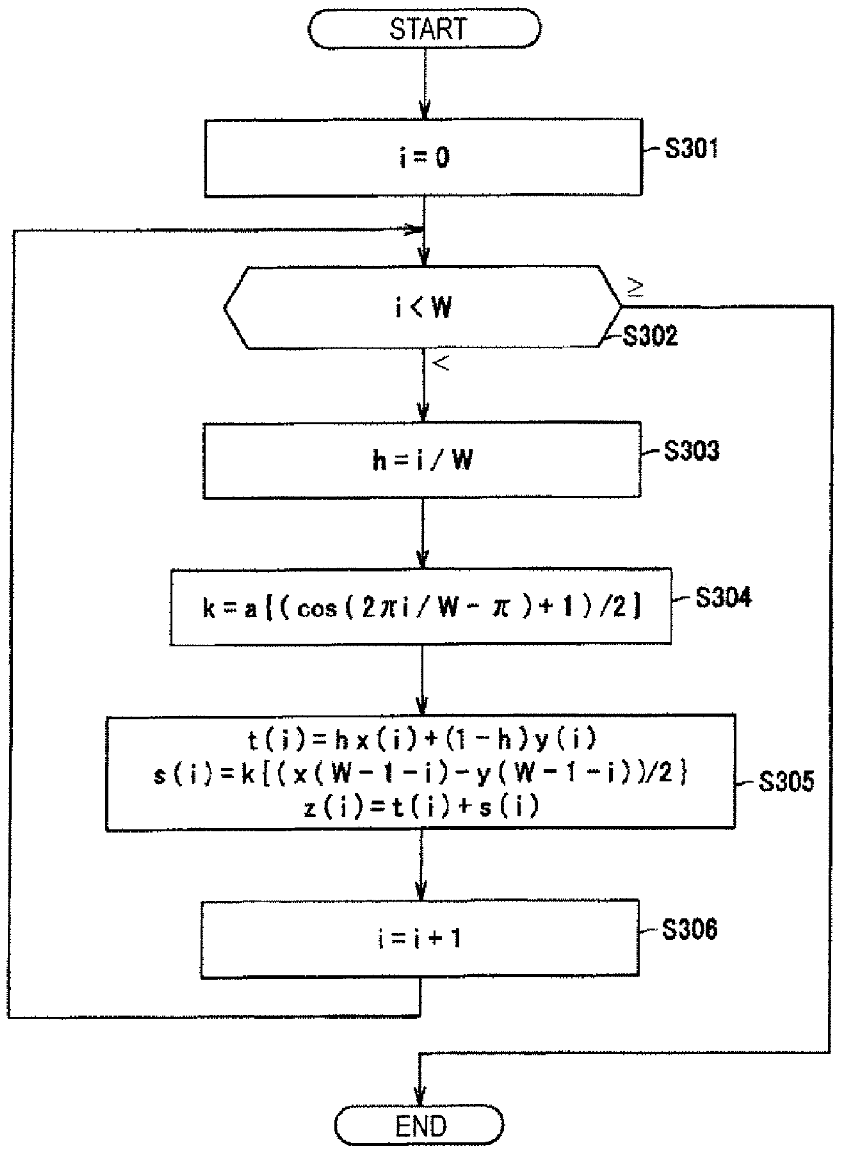
FIG. 10 is a flowchart illustrating connection-waveform generating processing at the time of employing the window function shown in FIG. 9.

Also, FIG. 9 is another example of the window function employed at the time of Generating the correction signal S. FIG. 10 is a flowchart for describing the signal processing employing the window function shown in FIG. 9.

In step S301, the index i is reset to zero. In step S302, determination is made regarding whether or not the index i is smaller than W, and in the case of being smaller than W, the flow proceeds to step S303, and in the case of not being smaller than W, the processing ends.

In step S303, weight h is obtained, and in step S304 the window function k shown in FIG. 9 is obtained.

$$k=a\{(\cos(2\pi i/W-\pi)+1)/2\} \tag{17}$$

Here, a coefficient a represents the strength of the correction signal determined by the user. For example, in the case of the a having a value close to zero, the strength of the correction signal is weak.

In step S305, the cross-fade signal generating unit 131 generates a cross-fade signal t(i) from the respective sample values x(i) and y(i), and at the same time, the time-axis reversal difference signal generating unit 132 generates a correction signal s(i) from the above-described Expression (14). Subsequently, the adder unit 133 generates a cross-fade signal z(i) serving as a connection waveform from those t(i) and s(i). In step S306, the index i is incremented by one, following which the flow returns to step S302, where the above-described processing is repeatedly performed. According to the above-described processing, an excellent speech rate conversion close to the original sound can be real zed, even if the signal to be processed is not only a speech signal but also an acoustic signal.

Thus, multiplying by the window function enables the difference signal to be matched with the envelope of the cross-fade period. Also, reversing the time axis of the difference signal enables the phase between the cross-fade period A×B and the correction signal S to be shifted, thereby serving as a correction signal in a sure manner.

Figure 11:
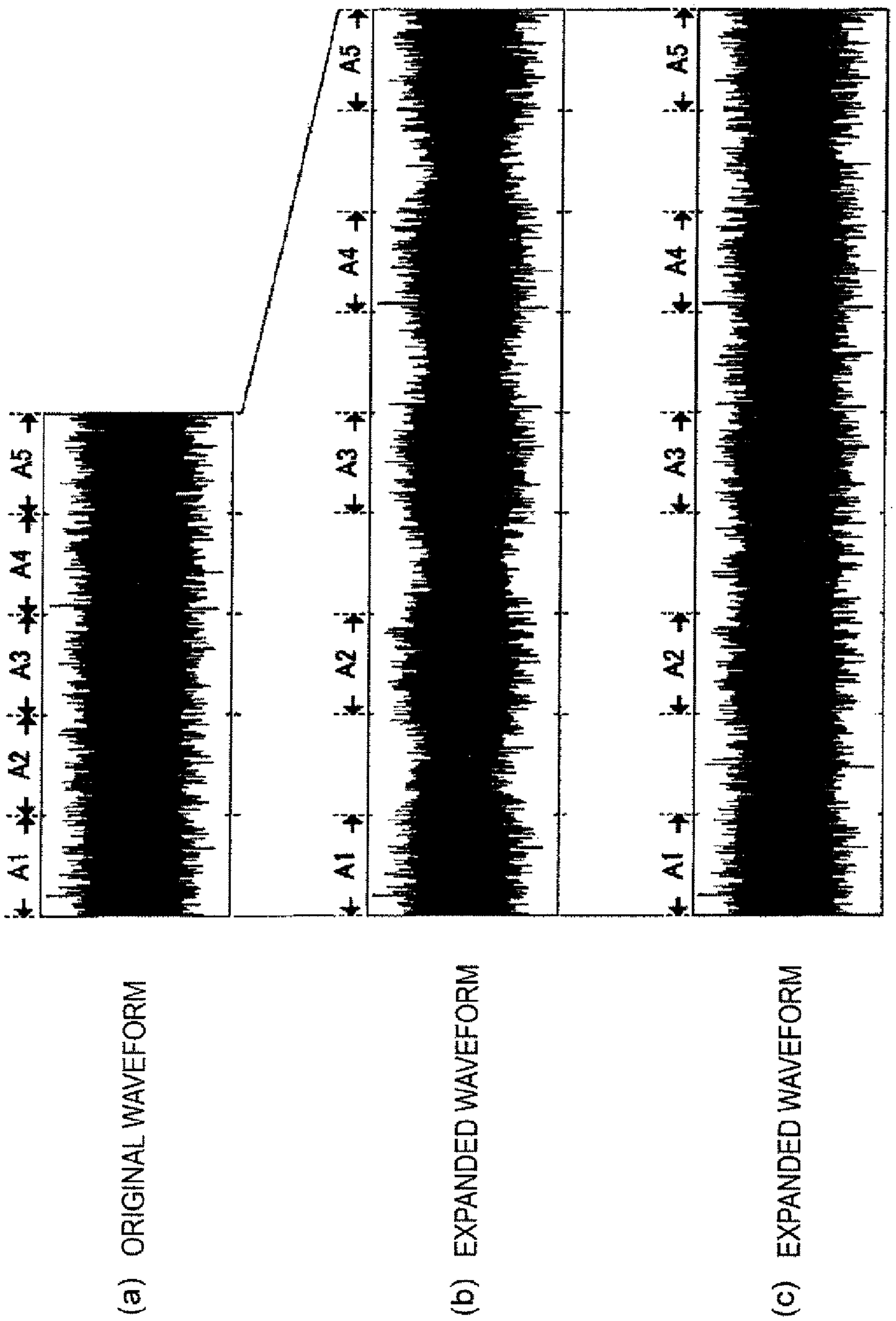
FIG. 11 is a diagram illustrating a specific example of the expanded waveform of white noise to which the present invention is applied.

For example, in the event of classifying the original waveform in (a) in FIG. 11 serving as white noise into five periods A1, A2, A3, A4, and A5, and expanding the original waveform with the existing method, surge-like allophone such as shown in (b) in FIG. 11, which does not exist in the original waveform, occurs in the waveform, but in the event of expanding the original waveform using the above-described window function, a waveform visually close to the original waveform (a) can be obtained such as shown in (c) in FIG. 11. Also, it can be confirmed that the sound aurally close to the original waveform (a) is output.

Figure 12:
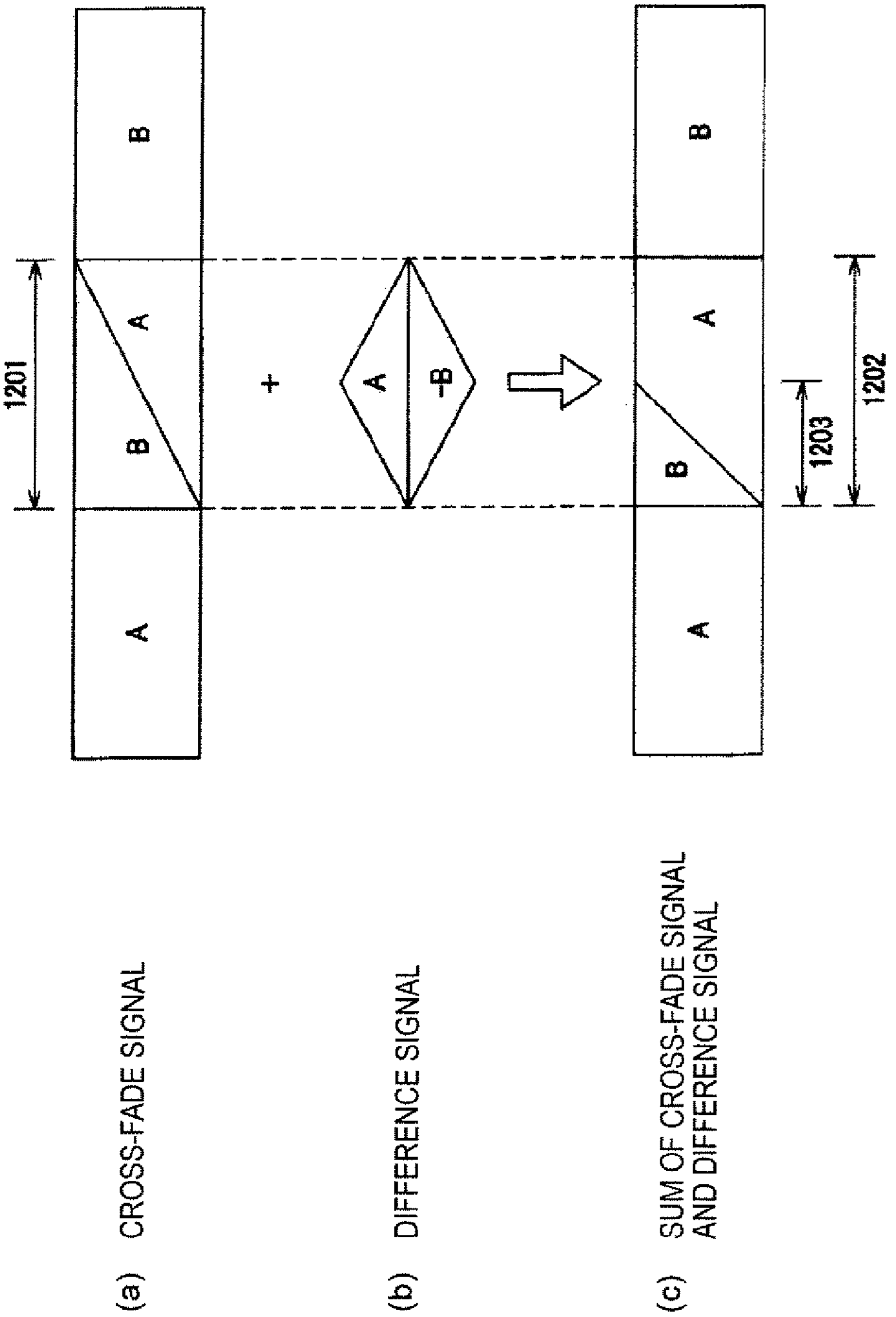
FIG. 12 is a schematic diagram illustrating signal processing when not reversing a time axis.

Also, the cross-fade in the case in which the time axis is not reversed is equivalent to the cross-fade at a substantially short period, and the length of the period whose amplitude is small is short as shown in FIG. 12, and accordingly, an advantage of attenuating surge-like allophone is not exhibited. Also, shortening the length of a cross-fade period causes a factor which generates another allophone.

Now, (a) in FIG. 12 schematically shows a waveform whose original sound made up of periods A and B is expanded using cross-fade, wherein a cross-fade period 1201 represents a ratio between the components of the period A and the components of the period B. Also, (b) in FIG. 12 is obtained by subtracting the signal of the period B from the signal of the period A, and multiplying the result thereof by the triangle window in FIG. 5, wherein the time axis thereof Is not reversed. This example illustrates the case of the waveforms of the periods A and B having an inverse phase, and when adding the signal in (b) in FIG. 12 to the signal in (a) in FIG. 12, consequently as shown in (c) in FIG. 12, cross-fade equivalent to around a half of the cross-fade period length in (a) in FIG. 12 is performed. Here, the reason why the position of a cross-fade period 1203 in (C) In FIG. 12 is the period A side in a period 1202, is that the difference signal in (b) in FIG. 12 is generated by subtracting the period B from the period A. Conversely, when generating the difference signal by subtracting the period A from the period B, the position of the cross-fade period 1203 in (c) in FIG. 12 is the period B side in the period 1202.

Note that in the case of the waveforms of the periods A and B having the same phase, the difference signal is close to zero, so the period 1202 in (c) in FIG. 12 is simple cross-fade as with the period 1201 in (a) in FIG. 12. Also, in the case of no phase, the difference signal is the middle of the period 1202 in (c) in FIG. 12 and the period 1201 in (a) in FIG. 12.

Thus, in the event that the time axis of the difference signal is not reversed, consequently the cross-fade applied to the difference signal is equivalent to that in the case of the cross-fade period length being suppressed less than the existing cross-fade period length, and accordingly, it is difficult to obtain excellent sound quality.

Incidentally, in the case of generating the correction signal S using one of the methods shown in FIGS. 5 through 10, the correction signal S and the cross-fade signal do not always have a positive correlation. These signals having a positive correlation reduces the components to be cancelled out in the addition between the correction signal and the cross-fade signal, as compared with the signals having a negative correlation. Therefore, the connection-waveform generating unit 13 obtains the correlation between both before the correction signal S is added to the cross-fade signal, and in the case of a negative correlation, always makes the correlation between both non-negative by reversing the sign of the correlation signal.

Figure 13:
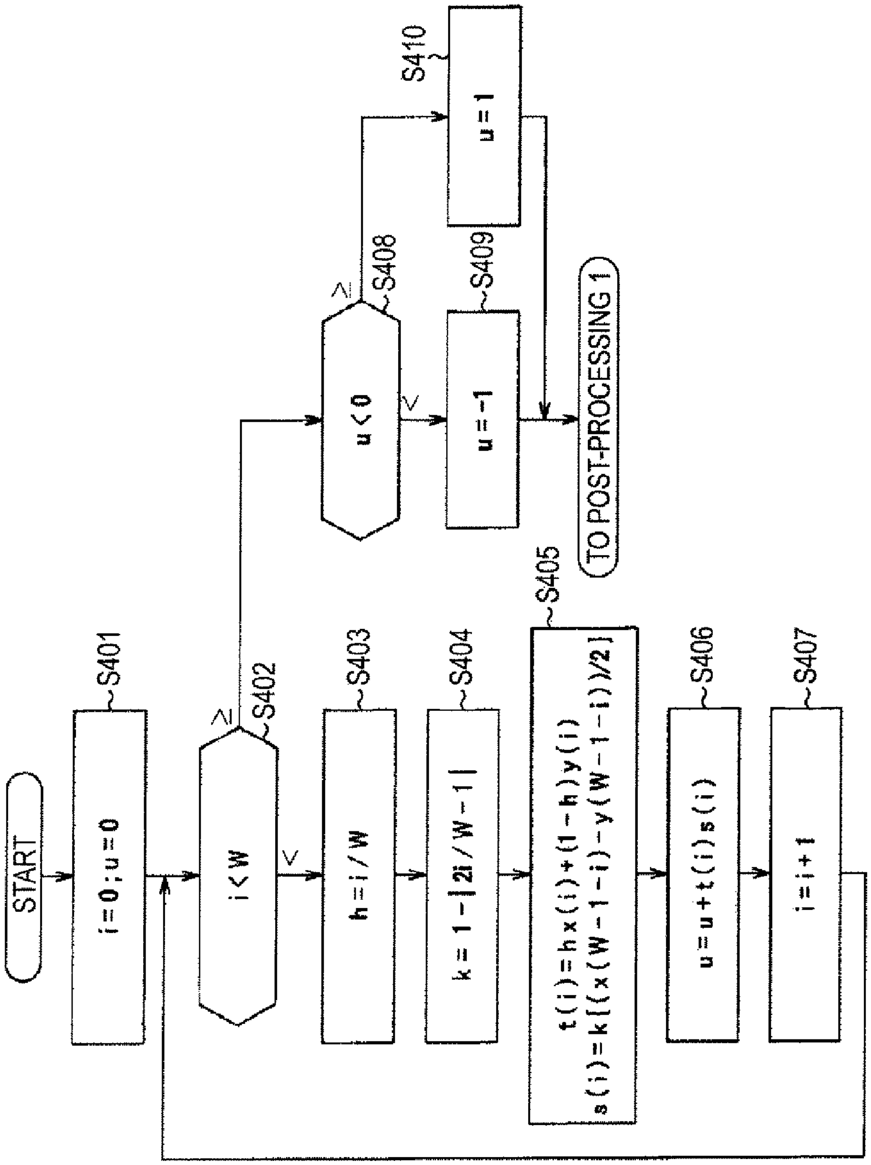
FIG. 13 is a flowchart (part 1) wherein a correction signal and a cross-fade signal are subjected to processing so as to have a non-negative correlation.
Figure 14:
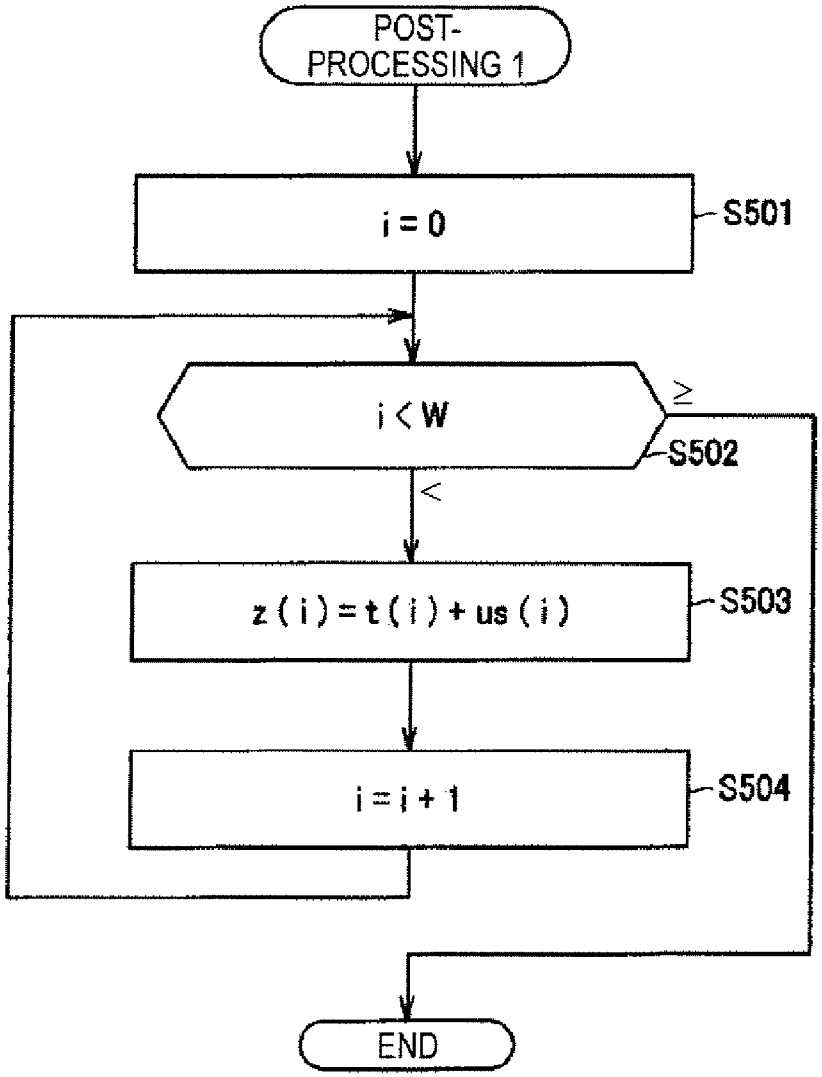
FIG. 14 is a flowchart (part 2) wherein the correction signal and the cross-fade signal are subjected to the processing so as to have a non-negative correlation.

FIGS. 13 and 14 are flowcharts wherein a correction signal and a cross-fade signal are subjected to processing so as to have a non-negative correlation.

in step S401, an index i and a coefficient u are reset to zero. In step S402, determination is made regarding whether or not the index i is smaller than W, and in the case of being smaller than W, the flow proceeds to step S403, and in the case of not being smaller than W, the flow proceeds to step S408. In step S403, weight h is obtained, and in step S404 the window function k is obtained. Note that the window function shown in FIG. 5 is employed here, but the window function to be employed is not restricted to this.

In step S405, the cross-fade signal generating unit 131 generates a cross-fade signal t(i) from the respective sample values x(i) and y(i), and at the same time, the time-axis reversal difference signal generating unit 132 generates a correction signal s(i) from the above-described Expression (14). In step S406, in order to obtain the correlation between the cross-fade signal t(i) and the correction signal s(i), the sum of the products of these signals is obtained. In step S407, the index i is incremented by one, following which the flow returns to step S402, where the above-described processing is repeatedly performed.

In step S408, determination is made regarding whether or not the correlation between the cross-fade signal t(i) and the correction signal s(i) is negative, and in the case of negative, the coefficient u is set to −1, and in the case of non-negative, the coefficient u is set to 1, and the flow proceeds to post-processing 1 shown in FIG. 14.

With the post-processing 1 shown in FIG. 14, the correction signal s(i) obtained in step S405 is multiplied by the coefficient u, following which the result thereof is added to the cross-fade signal t(i), thereby obtaining a cross-fade signal z(i) wherein surge-like allophone is prevented from occurring. That is to say, in step S501 the index i is reset to zero, and in step S502 determination is made regarding whether or not the index i is smaller than W, and in the case of being smaller than W, the flow proceeds to step S503, and in the case of not being smaller than W, the processing ends.

In step S503, the correction signal s(i) is multiplied by the coefficient u, following which the result thereof is added to the cross-fade signal t(i), thereby obtaining a cross-fade signal z(i) serving as a connection waveform $$z(i)=t(i)+us(i) \tag{18}$$

In step S504, the index i is incremented by one, following which the flow returns to step S502, where the above-described processing is repeatedly performed. According to the above-described processing, sound quality can be further improved.

Figure 15:
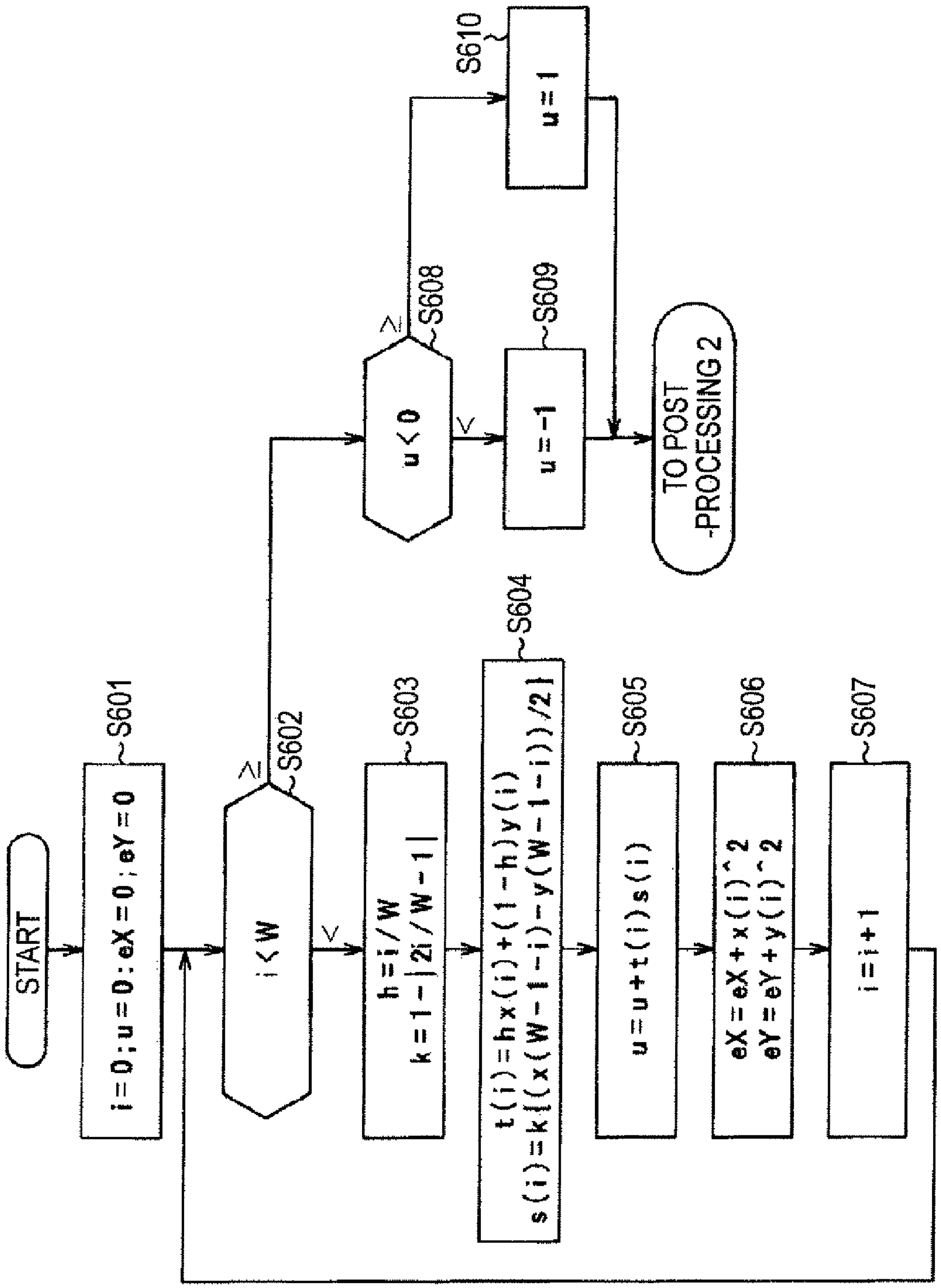
FIG. 15 is a flowchart (part 1) illustrating processing for regulating the strength of the correction signal S.

Also, there are cases in which the correlation between the cross-fade signal and the correction signal is close to no phase, and a case in which the degree of correction is weak. This Ls because inverse-phase components included in the correction signal have the operation which attenuates the cross-fade signal. Therefore, description will be made below regarding a method for obtaining the energy of two periods before cross-fade, and regulating the strength of the correction signal S based on the obtained energy with reference to the flowcharts shown in FIGS. 15 and 16.

In step S601, the index i, coefficient u, energy eX of the signal x(i), and energy eY of the signal y(i) are reset to zero. In step S602, determination is made regarding whether or not the index i is smaller W, and in the case of being smaller than W, the flow proceeds to step S603, and in the case of not being smaller than W, the flow proceeds to step S608. In step S603, the weight h and window function k are obtained. Note that the window function shown in FIG. 5 is employed here, but the window function to be employed is not restricted to this.

In step S604, the cross-fade signal generating unit 131 generates the cross-fade signal t(i), and the time-axis reversal signal generating unit 132 generates the correction signal s(i). In step S605, the sum of the products of these signals is obtained to obtain the correlation between the cross-fade signal t(i) and the correction signal s(i).

$$u=u+t(i)s(i) \tag{19}$$

In step S606, the sum of the squares of the respective sample values is obtained to obtain energy of the signal x(i) and signal y(i).

$$eX=eX+x(i)^{\wedge}2 \tag{20}$$

$$eY=eY+y(i)^{\wedge}2 \tag{21}$$

In step S607, the index is incremented by one, following which the flow returns to step S602, where the processing is repeatedly performed.

Figure 16:
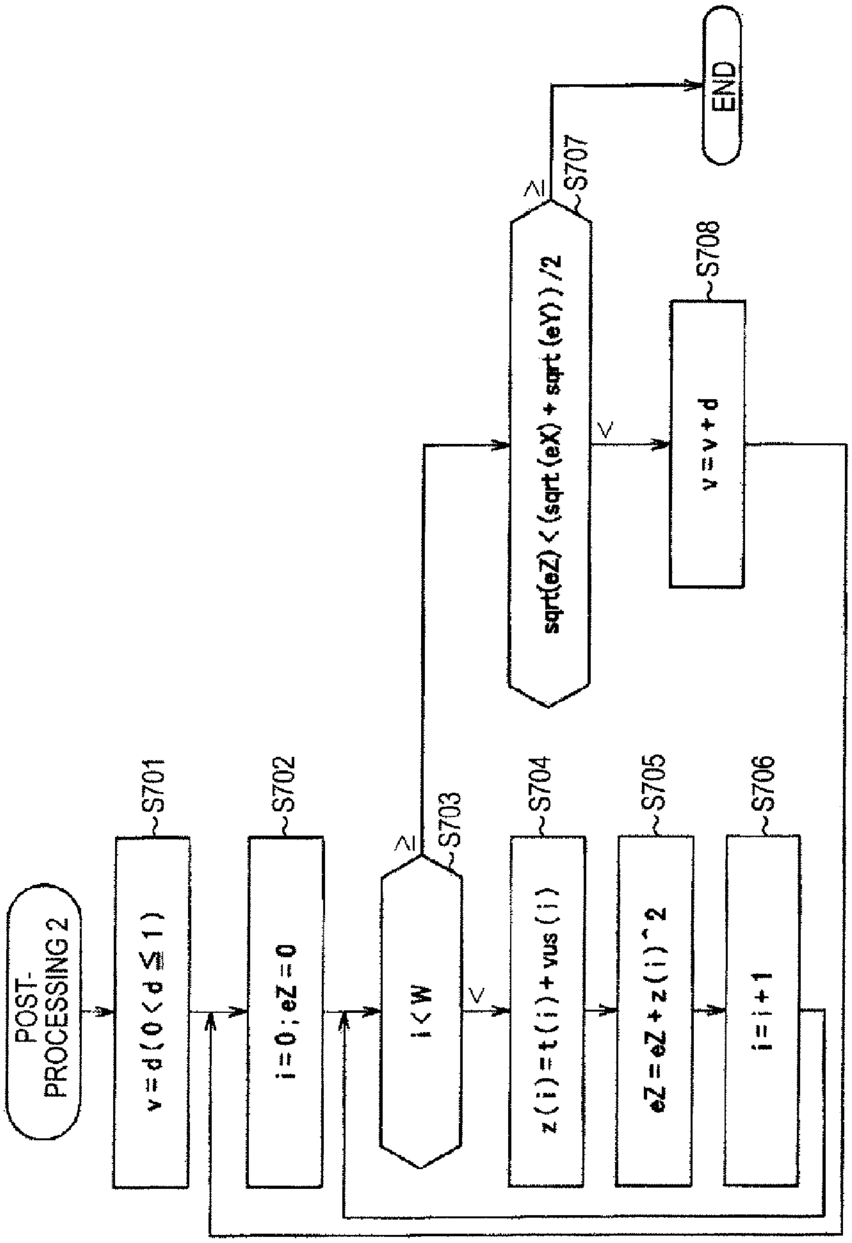
FIG. 16 is a flowchart (part 2) illustrating the processing for regulating the strength of the correction signal S.

In step S608, determination is made regarding whether or not the correlation between the cross-fade signal t(i) and the correction signal s(i) is negative, and in the case of negative, the coefficient u is set to −1, and in the case of non-negative, the coefficient u is set to 1, and the flow proceeds to post-processing 2 shown in FIG. 16.

With the post-processing 2 shown in FIG. 16, the correction signal s(i) obtained in step S604 is multiplied by the coefficient u to regulate the strength of the signal, and the result thereof is added to the cross-fade signal t(i), thereby obtaining a cross-fade signal z(i) wherein surge-like allophone is prevented from occurring.

In step S701, the amount of step d ($0<d\leqq 1$) is set to a coefficient v. The amount of step d can be determined arbitrarily such as 0.1 or the like for example. In step S702, the index i and energy eZ of the cross-fade period is reset to zero. In step S703, determination Is made regarding whether or not the index i is smaller than W, and in the case of being smaller than W, the flow proceeds to step S704, and in the case of not being smaller than W, the flow proceeds to step S707.

In step 704, the correction signal s(i) is multiplied by the coefficient u and coefficient v, following which the result thereof is added to the cross-fade signal t(i), thereby obtaining a cross-fade signal z(i) wherein surge-like allophone is prevented from occurring.

$$z(i)=t(i)+vus(i) \tag{22}$$

In step S705, the sum of the squares of the respective sample values is obtained to obtain the energy of the signal z(i).

$$eZ=eZ+z(i)^{\wedge}2 \tag{23}$$

In step S706, the index i is incremented by one, following which the flow returns to step S703, where the processing is repeatedly performed. In step S707, comparison is made between the energy of the signals of two periods before cross-fade and the energy of the signals after cross-fade. In the event that the energy of the signals after cross-fade is smaller than the energy of the signals of the two periods before cross-fade, the flow proceeds to step S708, where the amount of step d is added to the coefficient v, following which the flow returns to step S702, where the processing is repeatedly performed. In the event that the energy of the signals after cross-fade is not smaller than the energy of the signals of the two periods before cross-fade, the processing ends.

The above-described processing is performed, whereby the mean amplitude of the cross-fade signal z(i) becomes around the mean of the mean amplitude of the signals of the two periods before cross-fade, and sound quality can be further improved.

Second Embodiment

Next, description will be made regarding a second embodiment to which the present invention is applied. With the first embodiment, a cross-fade signal is generated with first and second periods which are continuous and similar within an audio signal, the difference signal between a first period signal and a second period signal is subjected to time-axis reversal, and is multiplied by a window function to generate a time-axis reversal difference signal serving as a correction signal, and the cross-fade signal and the correction signal are added to generate a connection waveform, but with the second embodiment, the signal obtained by subjecting the difference signal between a first period and a second period to time-axis reversal is added to the sum signal of the first period and the second period to generate a cross-fade signal, An audio-signal time-axis expansion/compression device 20 according to the second embodiment is the same as the audio-signal time-axis expansion/compression device 10 shown in FIG. 1, and is configured with an input buffer 11 for subjecting an input audio signal to buffering, a similar-waveform-length extracting unit 12 for extracting a continuous similar waveform length (equivalent to 2 W samples) from the audio signal of the input buffer 11, a connection-waveform generating unit 21 for subjecting the audio signals of 2 W samples to cross-fade to generate the connection waveforms of W samples, and an output buffer 14 for outputting an output audio signal made up of the input audio signal input in accordance with a speech rate conversion rate R, and a connection waveform. That is to say, the difference between the audio-signal time-axis expansion/compression device 20 according to the second embodiment and the audio-signal time-axis expansion/compression device 10 according to the first embodiment is connection-waveform generating processing. Note that the same configurations as those in the first embodiment are appended with the same reference numerals, and description thereof will be omitted.

Figure 17:
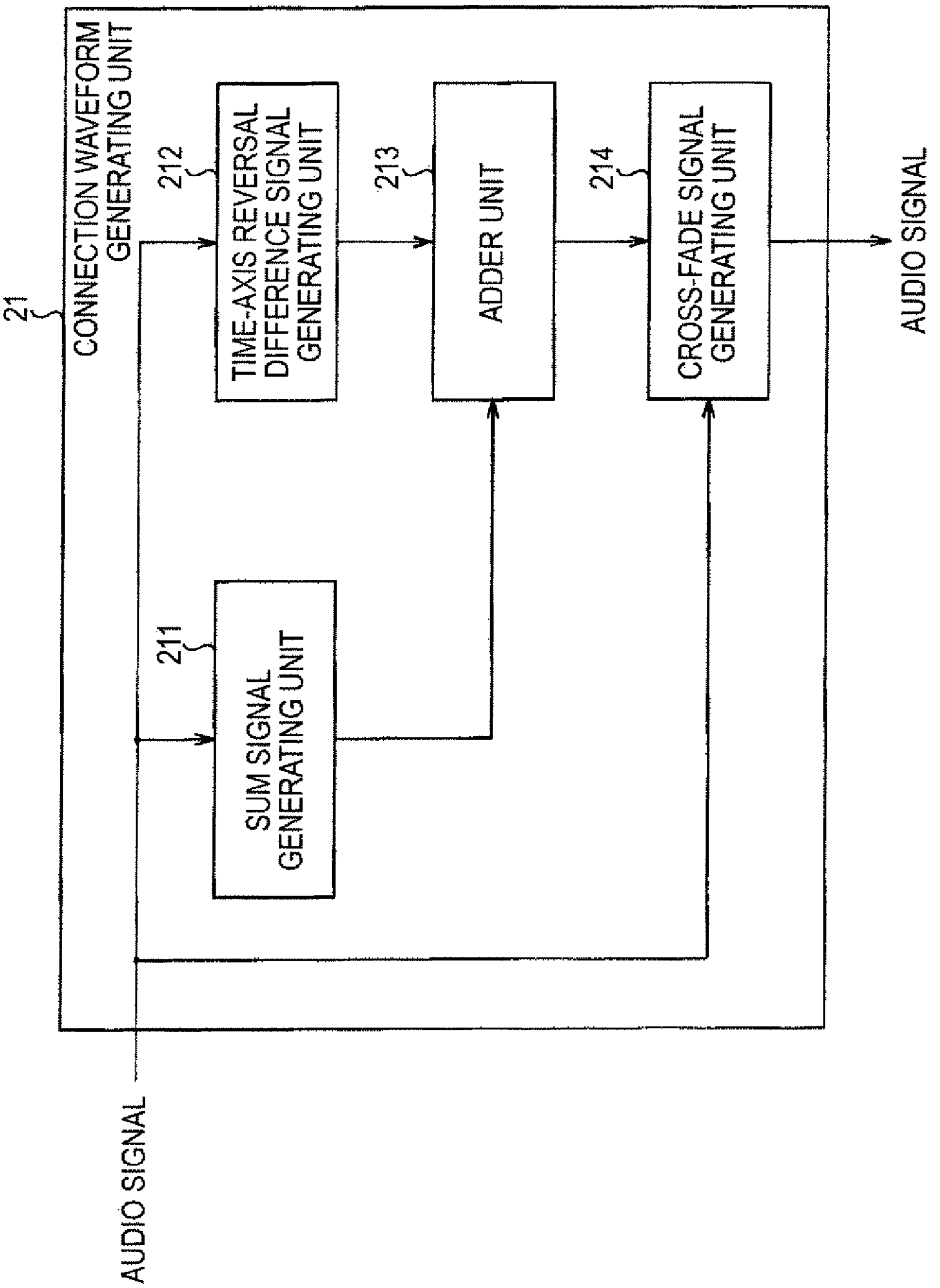
FIG. 17 is a block diagram illustrating the configuration of a connection-waveform generating unit according to a second embodiment.

FIG. 17 is a block diagram illustrating the configuration of the connection-waveform generating unit 21. The connection-waveform generating unit 21 includes a sum signal generating unit 211 for generating a sum signal from an input audio signal, a time-axis reversal difference signal generating unit 212 for generating a difference signal from an input audio signal, and generating a time-axis reversal difference signal wherein the time-axis of the difference signal thereof is reversed, an adder unit 213 for adding a time-axis reversal difference signal to a sum signal, and a cross-fade signal generating unit 214 for generating a cross-fade signal from a signal added at the adder unit 213.

Upon an audio signal for generating a connection waveform being input, the sum signal generating unit 211 generates a sum signal from the input audio signal. At the same time, the time-axis reversal difference signal generating unit 212 generates a difference signal from the input audio signal, reverses the time axis of the difference signal thereof to generate a time-axis reversal difference signal. The adder unit 213 adds the time-axis reversal difference signal generated at the time-axis reversal difference signal generating unit 212 to the sum signal generated at the sum signal generating unit 211. The cross-fade signal generating unit 214 subjects an input audio signal to cross-fade such that the signal added at the adder unit 213 is connected to before-and-after waveforms smoothly, and the audio signal serving as a result thereof is regarded as the output of the connection-waveform generating unit 21.

Figure 18:
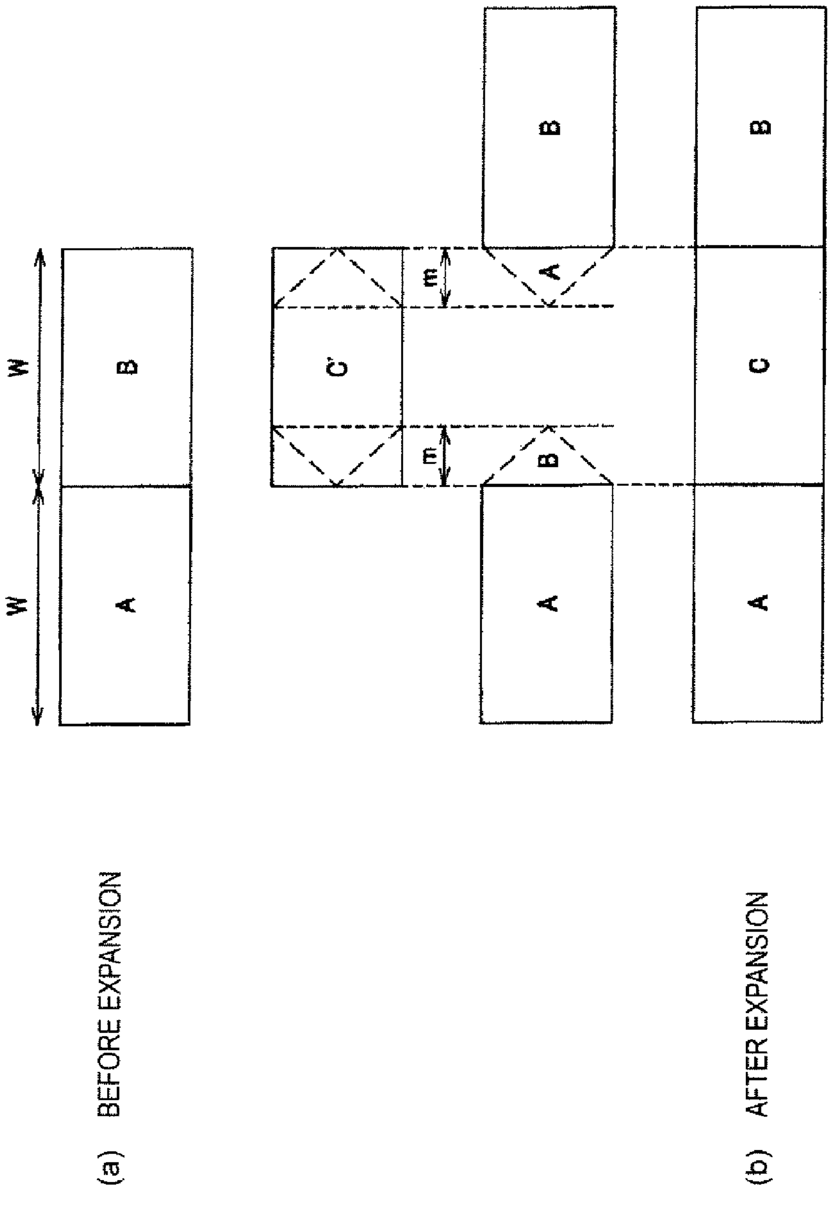
FIG. 18 is a schematic view illustrating processing for expanding an original waveform.

FIG. 18 is a schematic view illustrating processing for expanding an original waveform using the connection-waveform generating unit 21. With this time-axis expansion example, a new period C to be inserted between the period A and period B is obtained with Expression (24).

$$z(i)=(x(i)+y(i))/2+(x(W-1-i)-y(W-1-i))/2 \tag{24}$$

Here, each of the sample values of the period A is x(i) (i=0, 1, and so on through W−1), each of the sample values of the period B is y(i) (i=0, 1, and so on through W−1), and each of the sample values of the new period C is z(i) (i=0, 1, and so on through W−1). Also, the z(i) is obtained by adding the time-axis reversal of the difference signal to the sum signal of the periods A and B. That is to say, the z(i) is obtained by adding the time-axis reversal difference signal of the period A and period B generated at the time-axis reversal difference signal generating unit 212 to the sum signal of the period A and period B generated at the sum signal generating unit 211.

Further, the cross-fade signal generating unit 214 performs the following cross-fade to prevent the discontinuity of the waveforms at the time of connecting waveforms. That is to say, the cross-fade signal generating unit 214 fades in or fades out the waveform of continuous periods to retain the continuity of the waveform.

$$z(i)=hz(i)+(1-h)y(i) \tag{25}$$

$$z(W-1-i)=hz(W-1-i)+(1-h)x(W-1-i) \tag{26}$$

$(h=i/m,\ 0\leqq m\leqq W/2)$

Here, m represents the number of cross-fade samples to be performed at the time of connecting a connection waveform to the before-and-after waveforms to which the connection waveform is connected, and in the case of performing no cross-fade, m=0 holds, and the maximum number of cross-fade samples is m=W/2.

Figure 19:
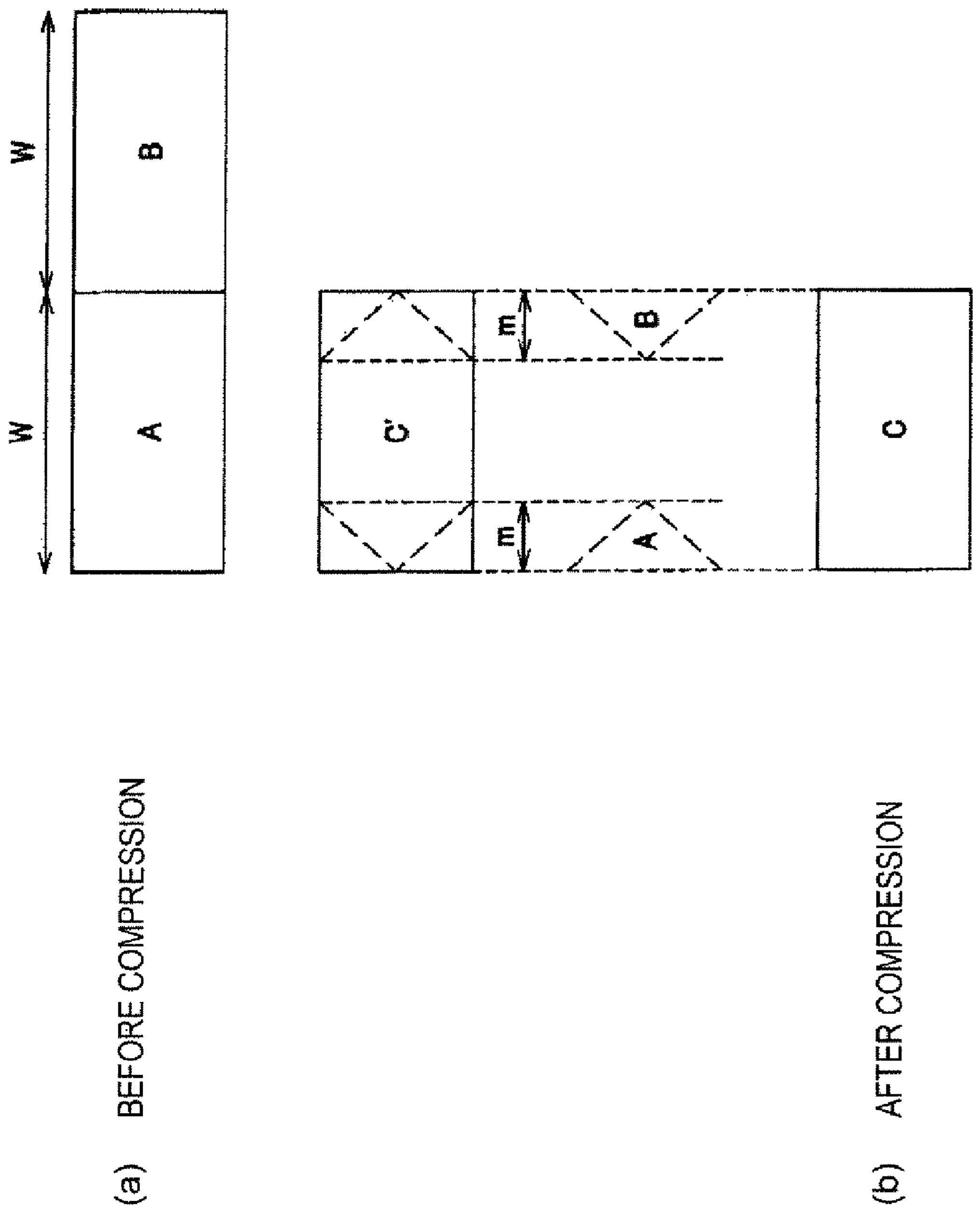
FIG. 19 is a schematic view illustrating processing for compressing the original waveform.

Also, FIG. 19 is a schematic view illustrating processing for compressing an original waveform by the connection-waveform generating unit 21. With this time-axis compression example, if we say that each of the sample values of the period A is y(i) (i=0, 1, and so on through W−1), and each of the sample values of the period B is x(i) (i=0, 1, and so on through W−1), each of the sample values of the period C is z(i) can be obtained with the same calculation as that of the above-described time-axis expansion As described above, the signal obtained by subjecting the difference signal to time-axis reversal is added to the sum signal of the two periods, and this is inserted with cross-fade, whereby excellent sound quality suppressing surge-like allophone can be obtained even with not only a speech signal but also an acoustic signal.

Figure 20:
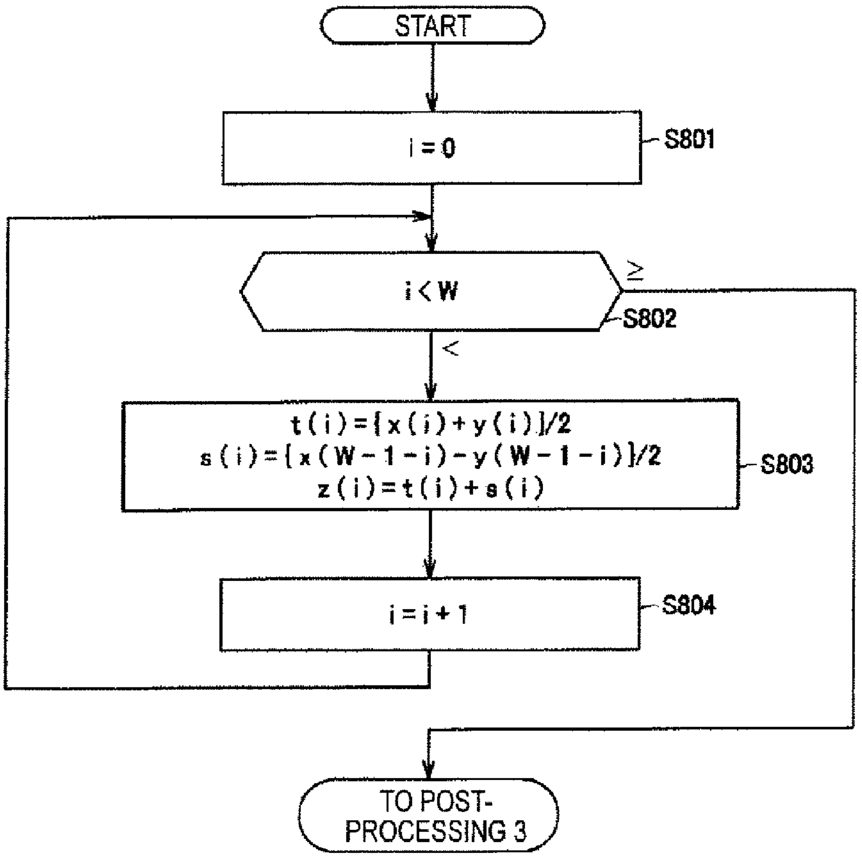
FIG. 20 is a flowchart (part 1) illustrating connection-waveform generating processing.
Figure 21:
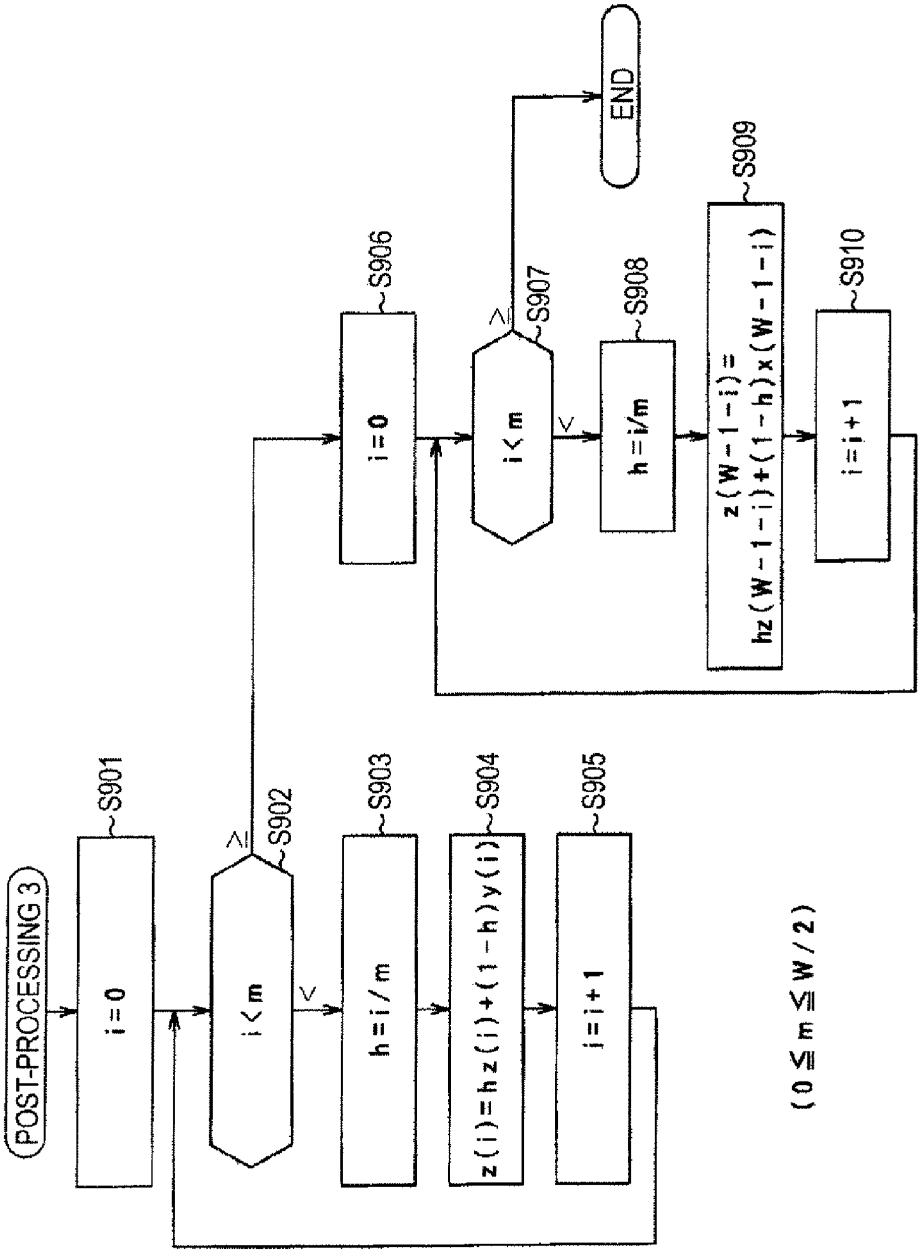
FIG. 21 is a flowchart (part 2) illustrating the connection-waveform generating processing.
Figure 22:
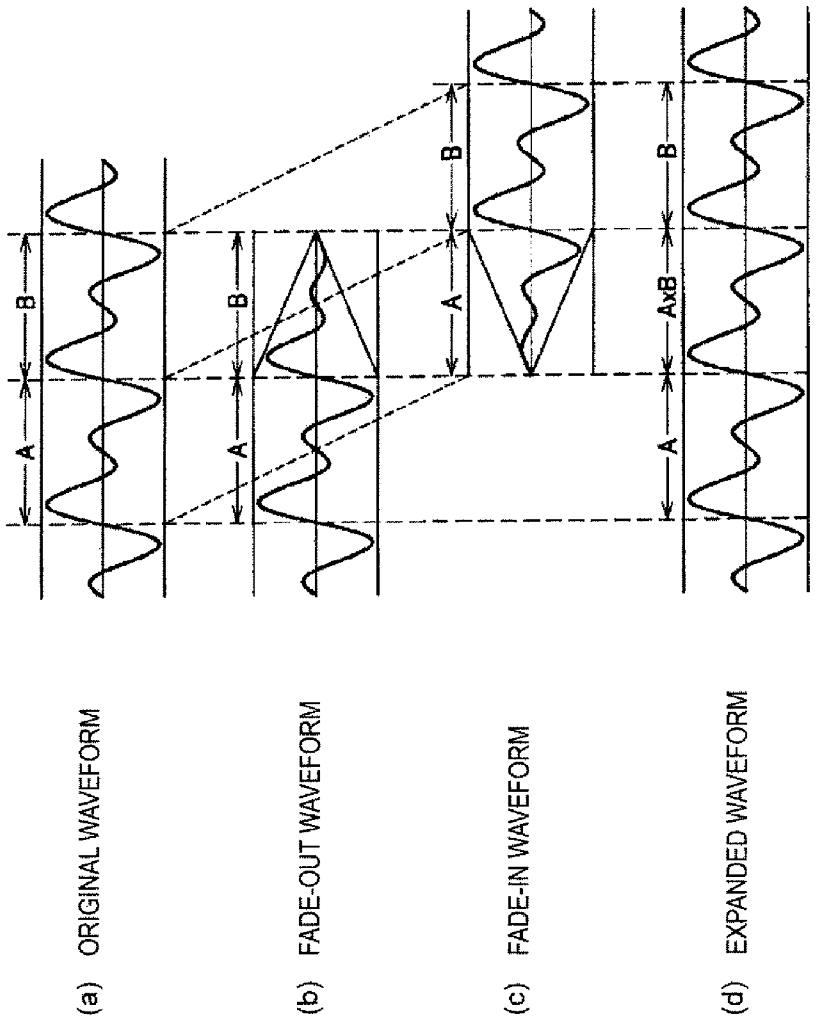
FIG. 22 is a schematic view illustrating an example wherein an original waveform is expanded with PICOLA.
Figure 23:
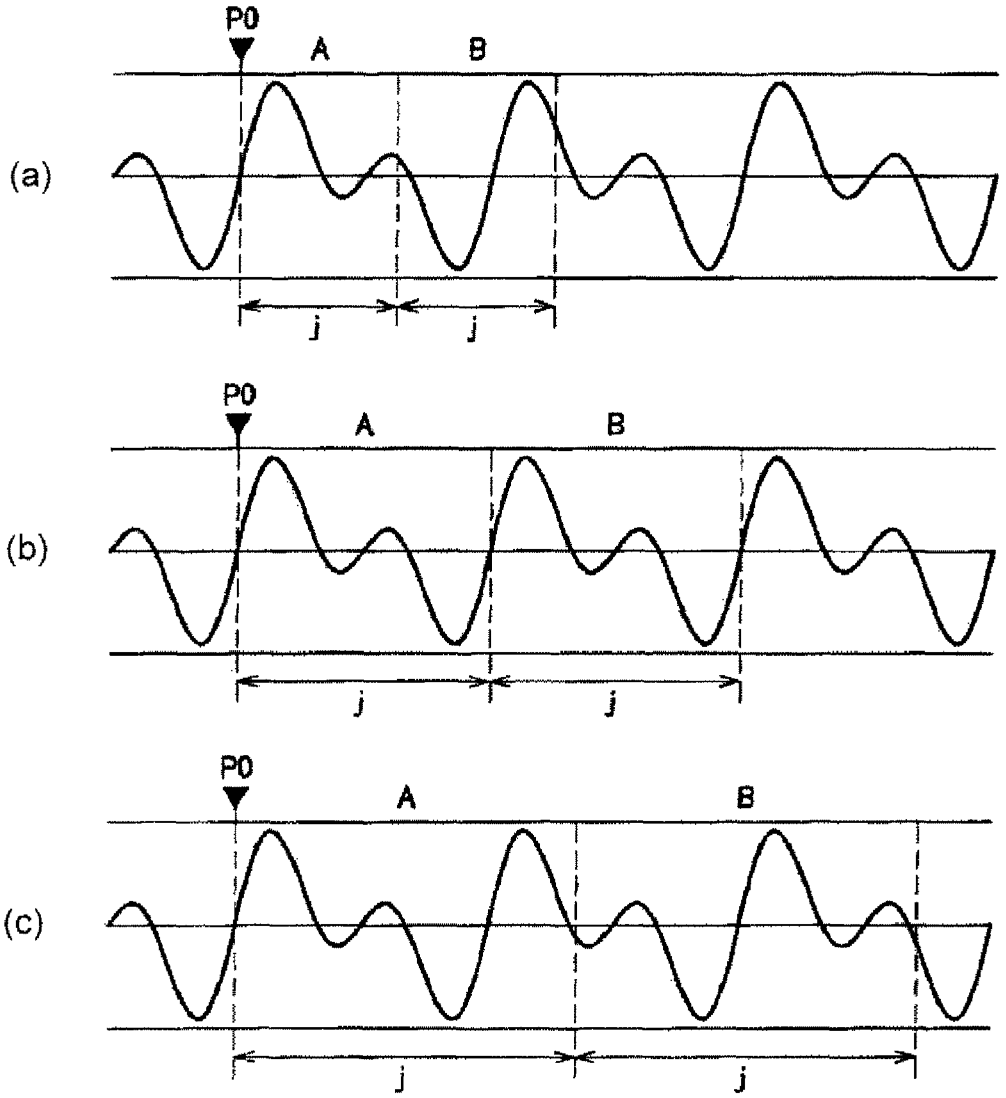
FIG. 23 is a schematic view illustrating a method for detecting the period length W of a period A and a period B which have a similar waveform.
Figure 24:
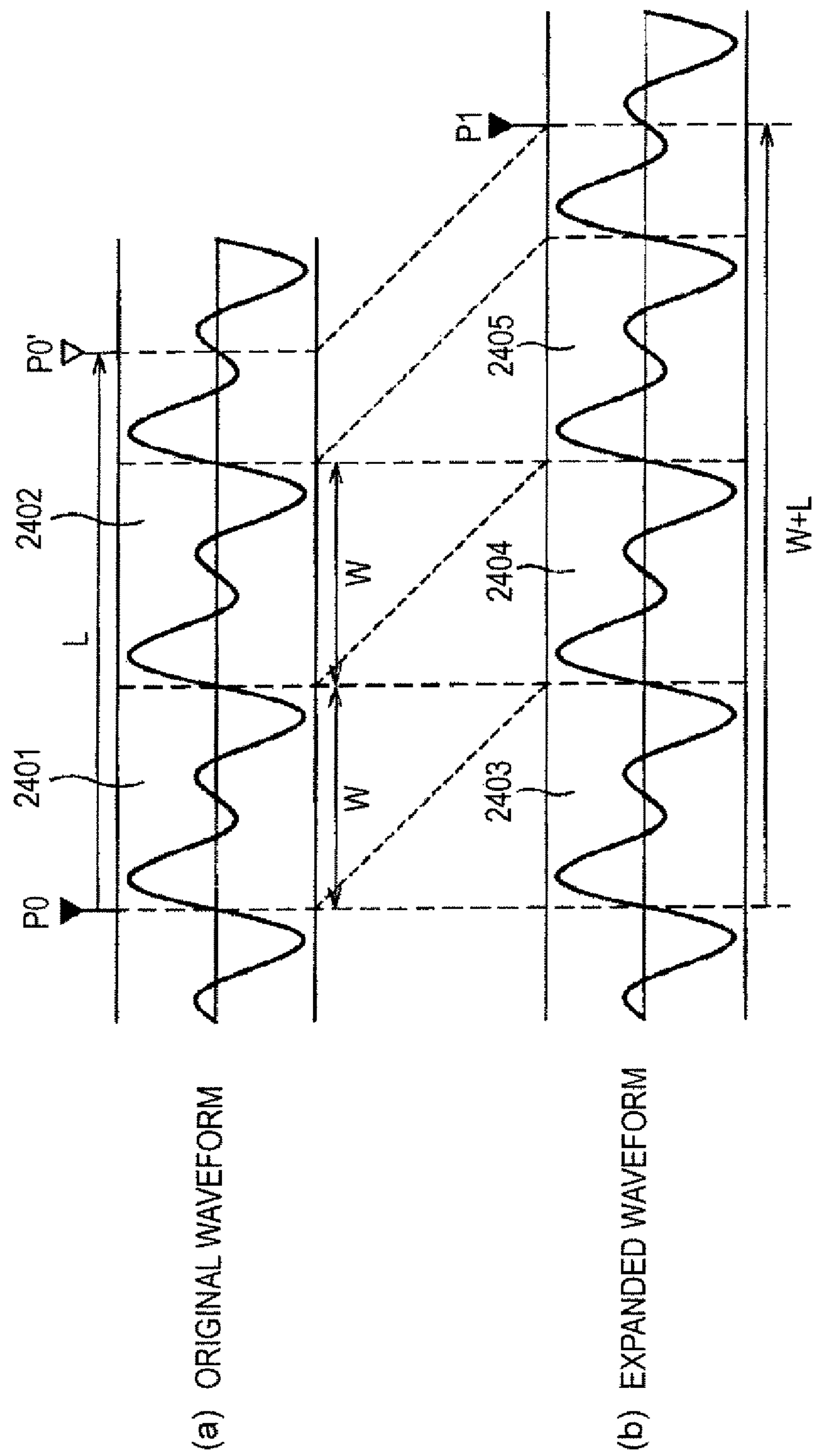
FIG. 24 is a schematic view illustrating a method for expanding a waveform into an arbitrary length.
Figure 25:
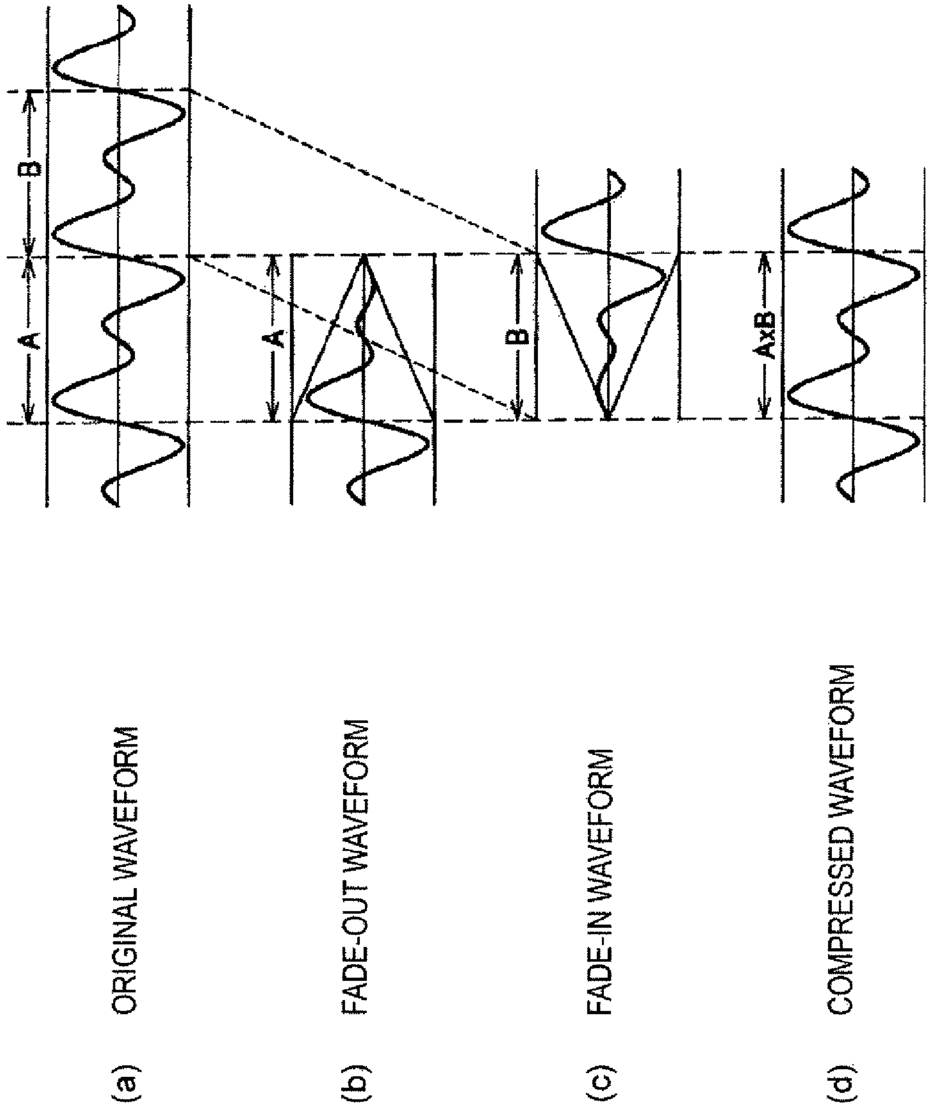
FIG. 25 is a schematic view illustrating an example wherein the original waveform is compressed with PICOLA.
Figure 26:
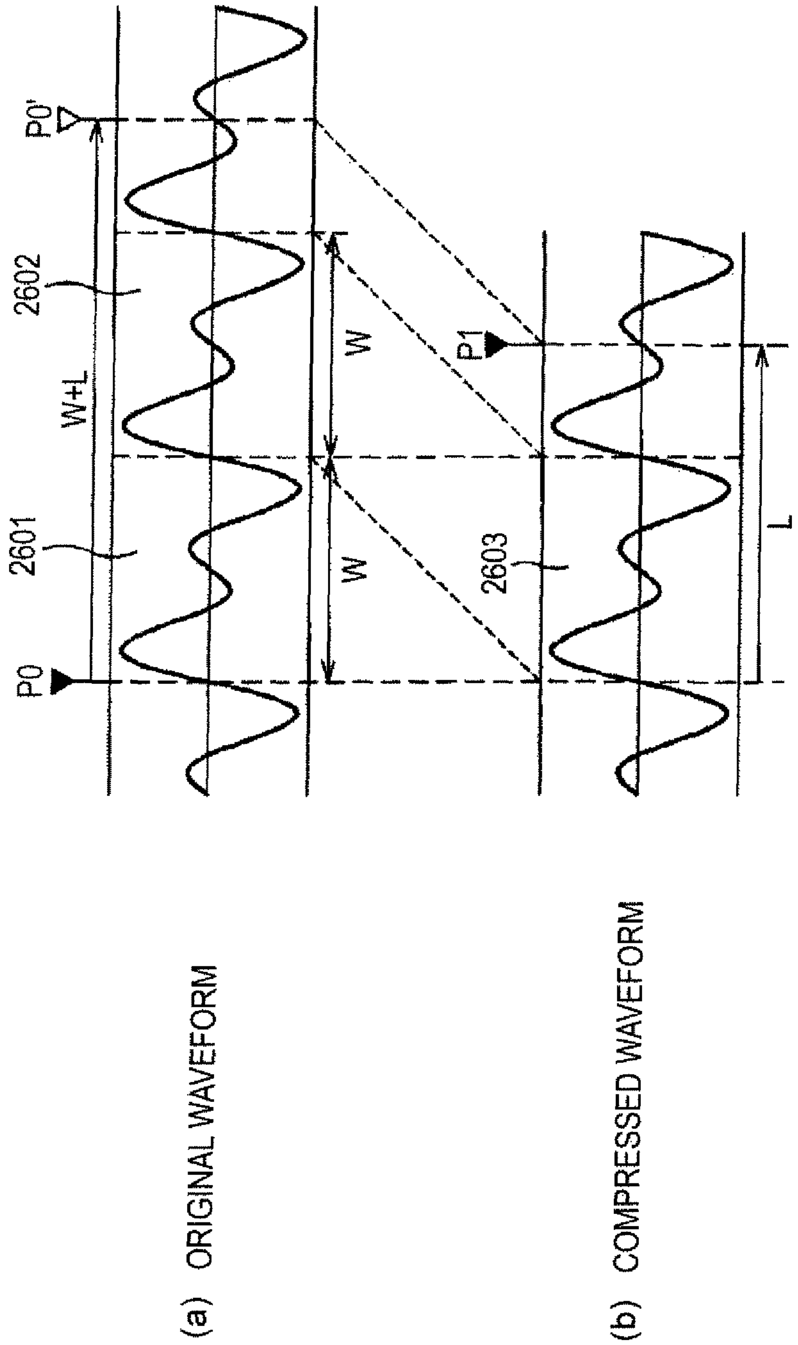
FIG. 26 is a schematic view illustrating a method for compressing a waveform into an arbitrary length.
Figure 27:
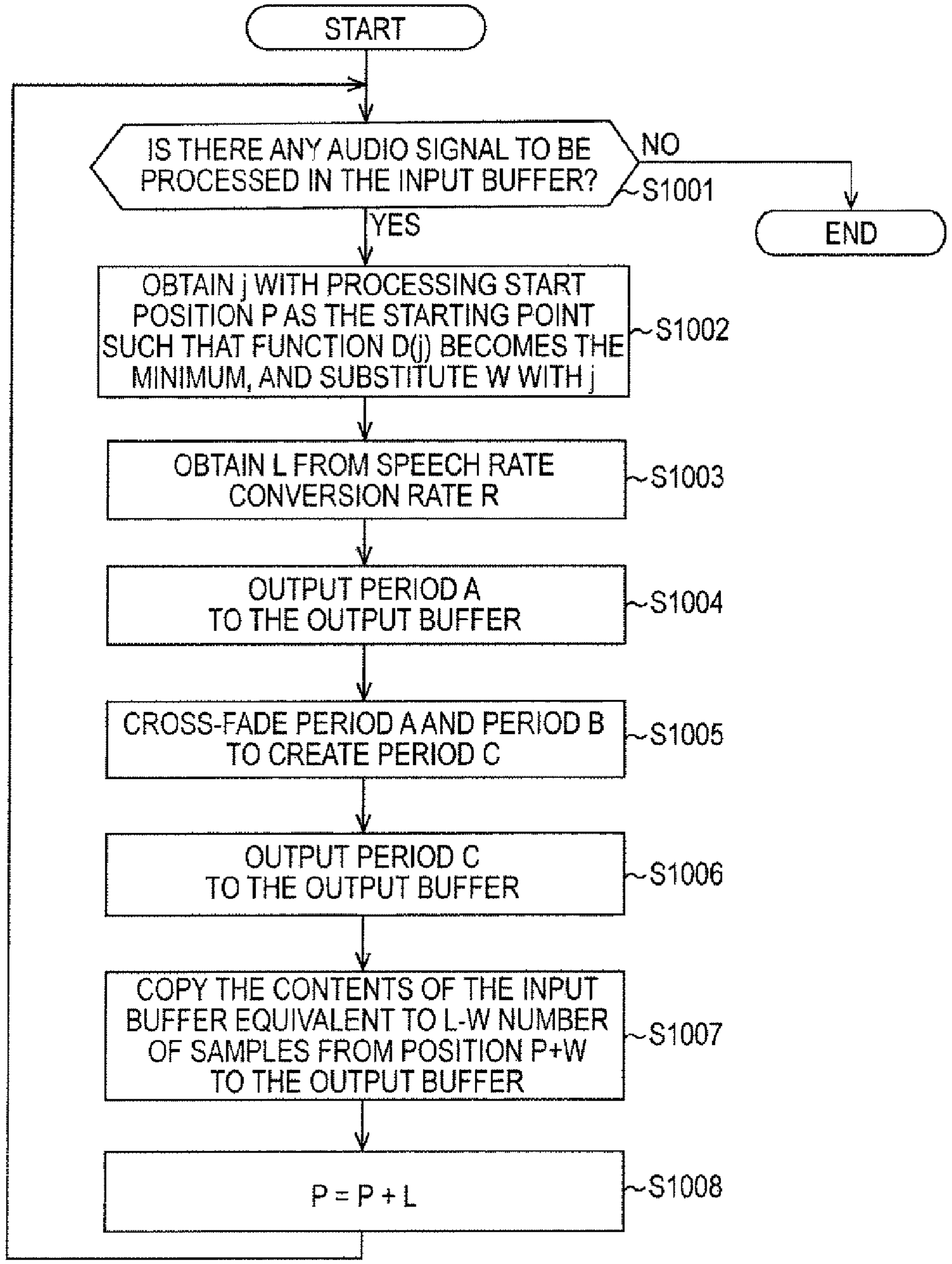
FIG. 27 is a flowchart illustrating the flow of the waveform time-axis expansion processing of PICOLA.
Figure 28:
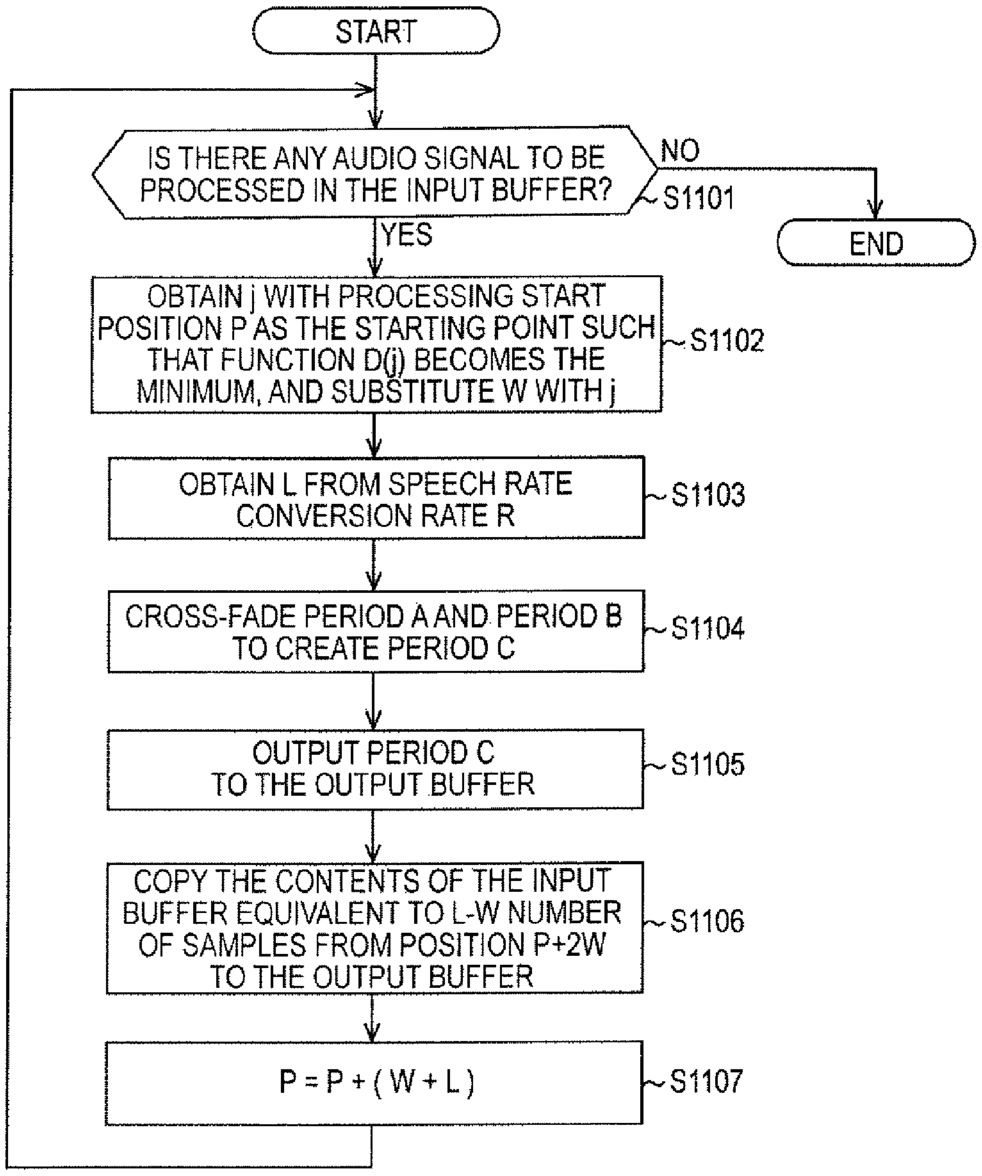
FIG. 28 is a flowchart illustrating the flow of the waveform time-axis compression processing of PICOLA.
Figure 29:
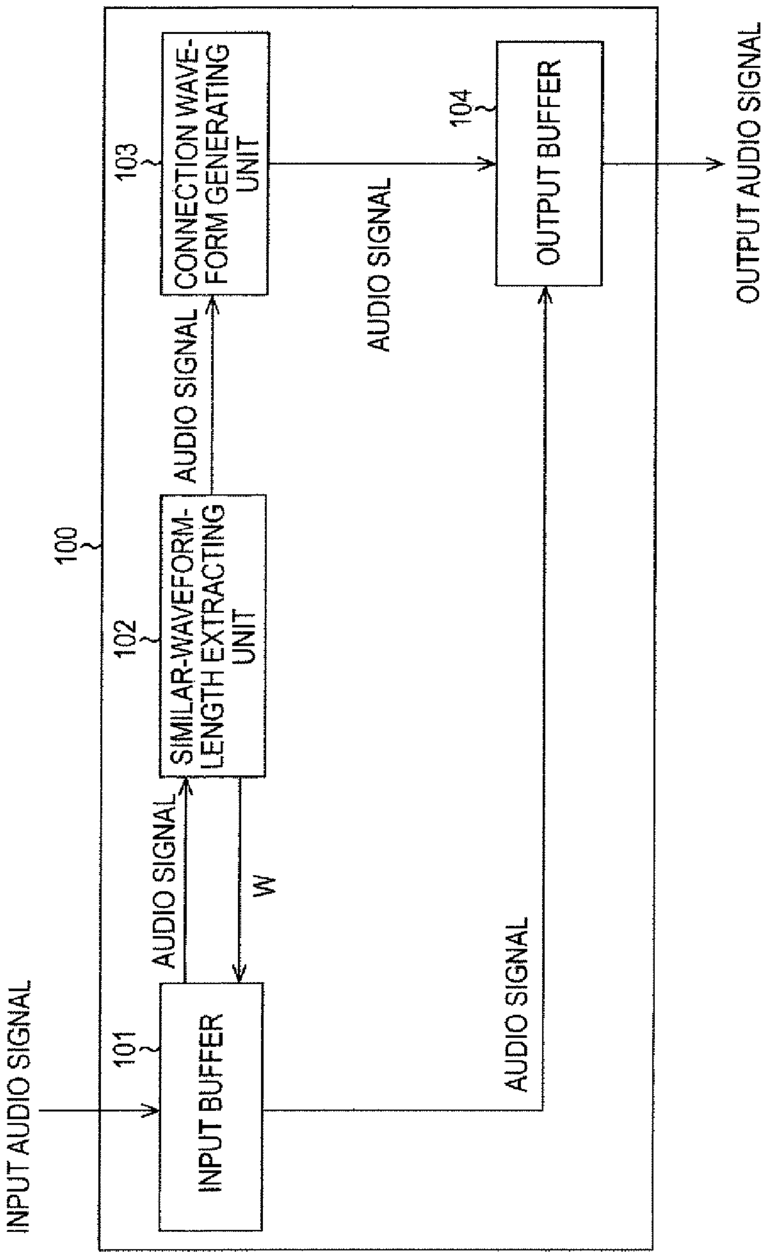
FIG. 29 is a block diagram illustrating one example of the configuration of a speech-rate conversion device according to PICOLA.
Figure 30:
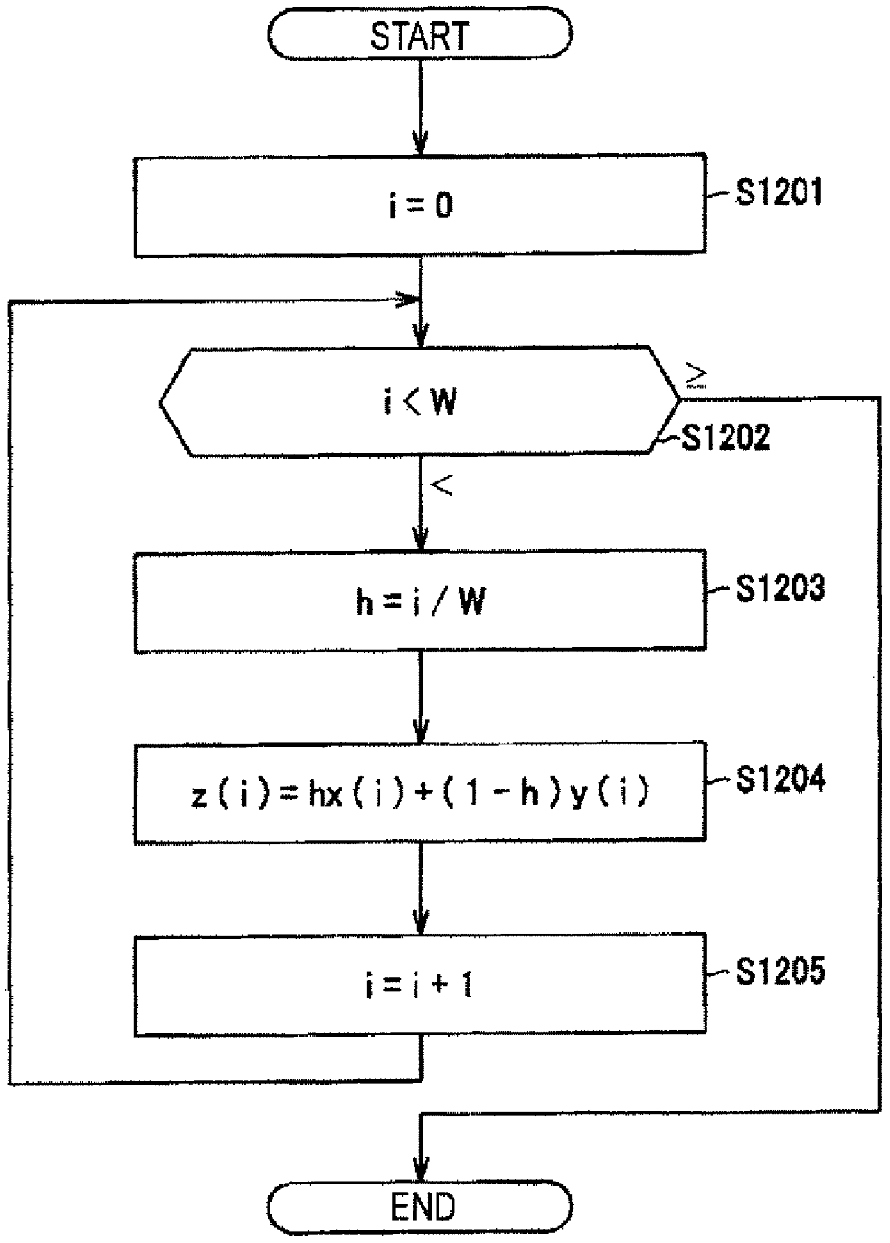
FIG. 30 is a flowchart illustrating the flow of processing of the connection-waveform generating unit.
Figure 31:
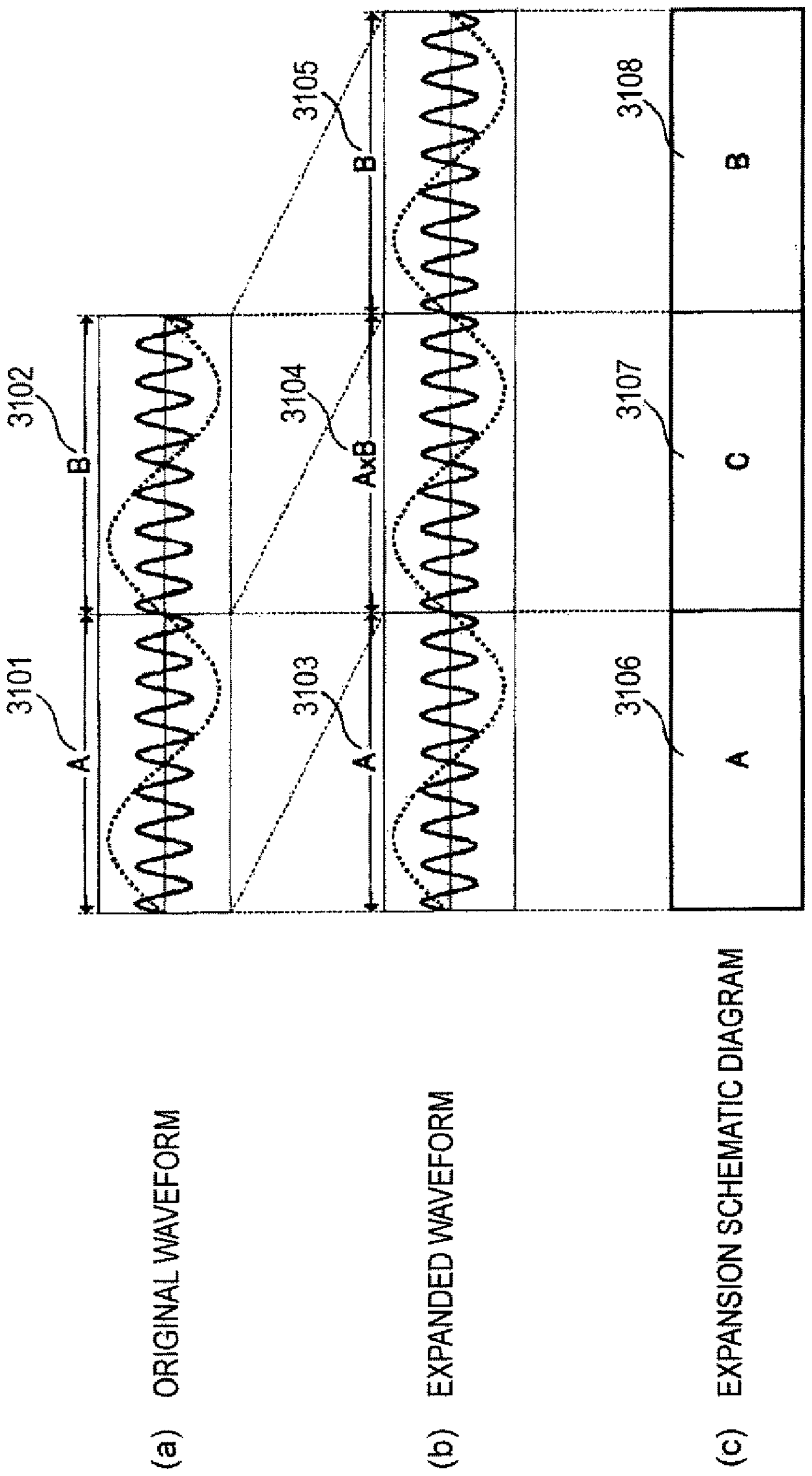
FIG. 31 is a schematic view illustrating the sates of waveforms in the case of obtaining an expanded waveform (b) by expanding the waveform (a) of a period A and a period B.
Figure 32:
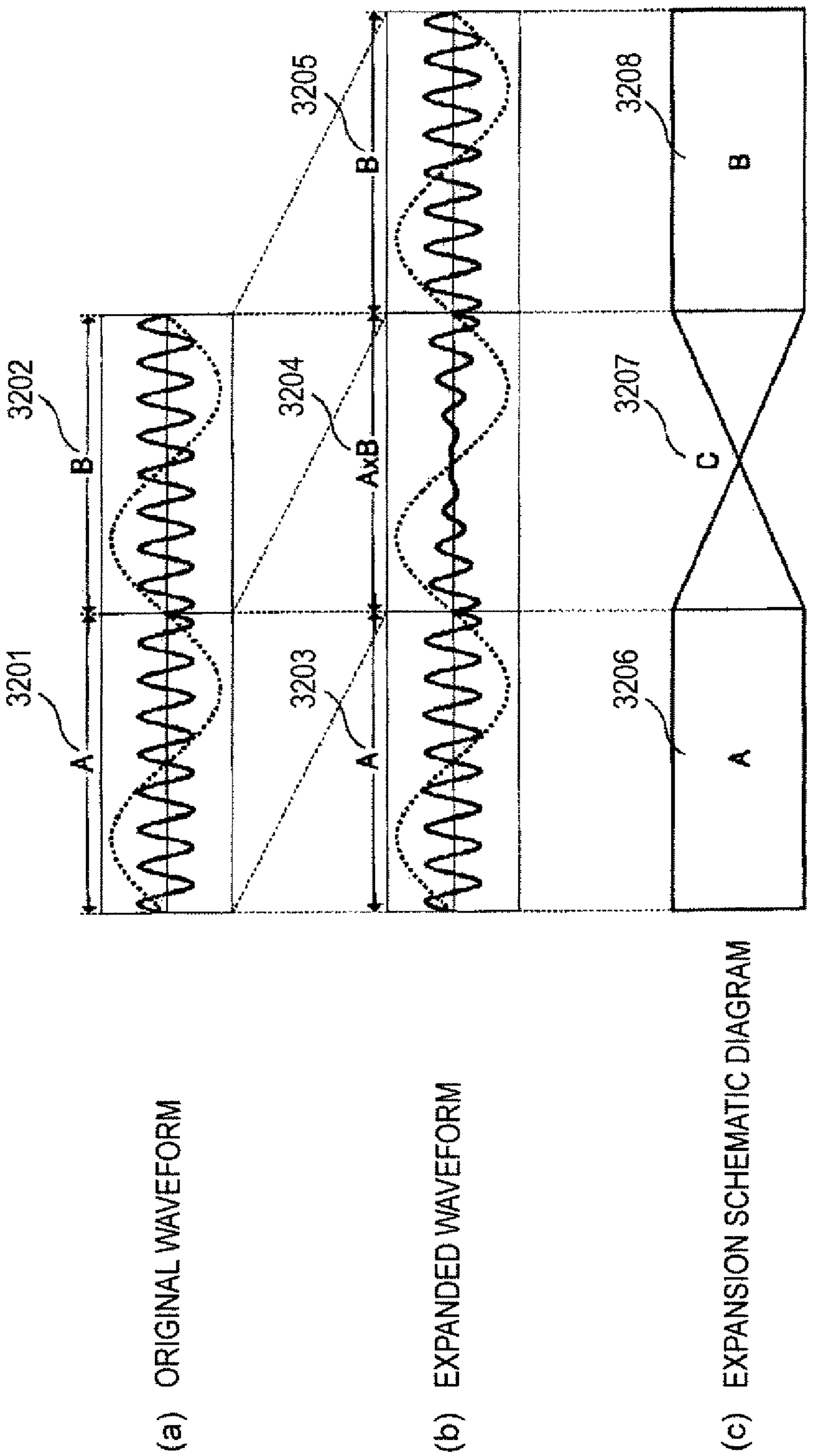
FIG. 32 is a schematic view illustrating the sates of waveforms in the case of obtaining an expanded waveform (b) by expanding the waveform (a) of a period A and a period B.
Figure 33:
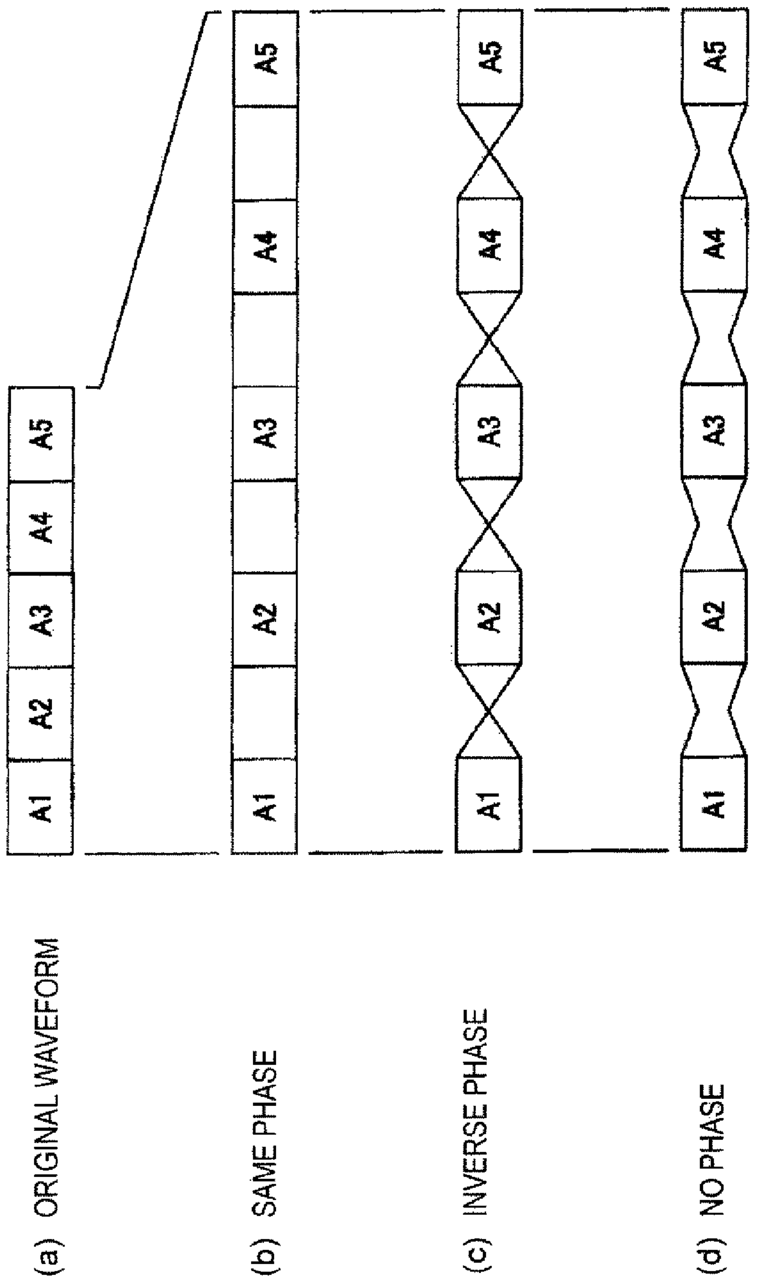
FIG. 33 is a schematic view illustrating the states of waveforms in the case of obtaining an expanded waveform by expanding the five periods A1, A2, A3, A4, and A5 of an original waveform.
Figure 34:
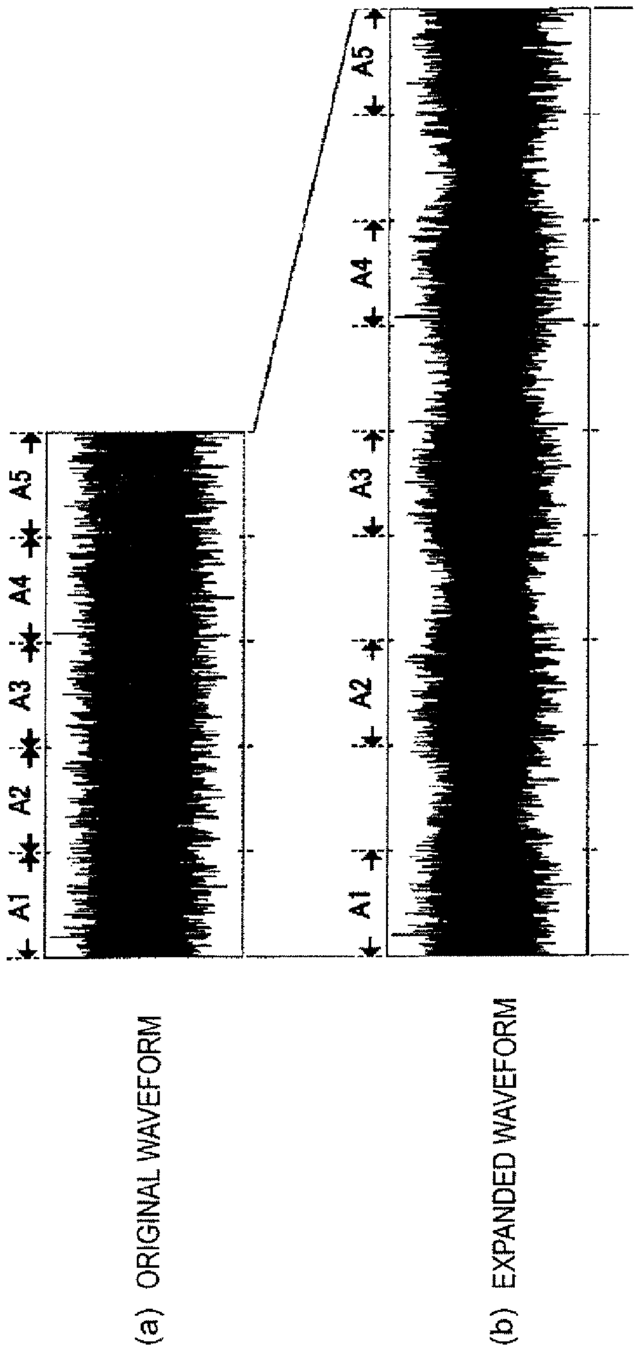
FIG. 34 is a diagram illustrating a specific example of the expanded waveform of white noise.

FIGS. 20 and 21 are one example of flowcharts in the case of performing speech rate conversion using the connection-waveform generating unit 21 according to the second embodiment.

In step S801, the index i is reset to zero. In step S802, determination is made regarding whether or not the index is smaller than W, and in the case of being smaller than W, the flow proceeds to step S803, and in the case of not being smaller than W, the flow proceeds to post-processing 3.

In step S803, as shown in the above-described Expression (24), the sum signal t(i) of the two periods generated at the sum signal generating unit 211, and the time-axis reversal difference signal s(i) obtained by subjecting the difference signal generated at the time-axis reversal difference signal generating unit 212 to time-axis reversal, are added at the adder unit 213, thereby obtaining z(i). In step S804, the index i is incremented by one, following which the flow returns to step 5802, where the processing is repeatedly performed.

With the post-processing 3 shown in FIG. 21, in step S901 the index i is reset to zero, and in step S902 determination is made regarding whether or not the index i is smaller than the m, and in the case of being smaller than m, the flow proceeds to step S903, and in the case of not being smaller than m, the flow proceeds to step S906.

In step S903 and step S904, the cross-fade signal generating unit 214 obtains weight h, and performs cross-fade such that a connection waveform and the previous waveform thereof are connected smoothly.

In step S905, the index i is incremented by one, following which the flow returns to step S902, where the processing is repeatedly performed. In step S906 the index i is reset to zero, and in step S907 determination is made regarding whether or not the index i is smaller than the m, and in the case of being smaller than m, the flow proceeds to step S908, and in the case of not being smaller than m, the processing ends.

In step S908 and step S909, the cross-fade signal generating unit 214 obtains weight h, and performs cross-fade such that a connection waveform and the previous waveform thereof are connected smoothly.

In step S910, the index i is incremented by one, following which the flow returns to step S907, where the processing is repeatedly performed.

As described above, when generating a connection waveform, the time-axis reversal of the difference signal of the original two waveforms is added, whereby an advantage can be obtained wherein surge-like allophone, which is apt to occur at the time of speech rate conversion, is prevented from occurring. Also, as can be clearly understood from the above description, an advantage can be obtained in that the attenuation of mean amplitude which is apt to occur at the time of speech rate conversion can be suppressed.

Note that with the above description, substitution of the existing PICOLA cross-fade processing has been shown, but the method of the present invention is not restricted to this, and the present Invention can be applied to a time-axial speech rate conversion algorithm accompanying cross-fade processing, such as the other OLA (Overlap and Add) family algorithm and the like. Also, in the event of fixing a sampling frequency, PICOLA becomes speech rate conversion, and in the event of changing a sampling frequency in accordance with increase/decrease of the number of samples, PICOLA becomes pitch shift, and accordingly, the present invention can be applied to not only speech rate conversion but also pitch shift.

It should be understood by those skilled In the art that various modifications, combinations, sub-combinations and alterations may occur depending on design requirements and other factors insofar as they are within the scope of the appended claims or the equivalents thereof.

What is claimed is:

1. An audio-signal time-axis expansion/compression method for subjecting an audio signal to time-axis expansion/compression at a time domain, said method comprising the steps of:

cross-fade-signal generating wherein a first period and a second period which are similar within said audio signal are employed to generate the cross-fade signal of said first period signal and said second period signal;

correction-signal generating wherein the difference signal between said first period signal and said second period signal is subjected to time-axis reversal, and is multiplied with a window function to generate a correction signal; and connection-waveform generating wherein said cross-fade signal and said correction signal are added to generate a connection waveform for subjecting said audio signal to time-axis expansion/compression at said time domain.

2. The audio-signal time-axis expansion/compression method according to claim 1, wherein said connection waveform is inserted between said first period and said second period at the time of expanding said audio signal at a time domain, and is substituted with a period where said first period and said second period are overlapped at the time of compressing said audio signal at said time domain.

3. The audio-signal time-axis expansion/compression method according to claim 1, wherein said window function is a triangle window.

4. The audio-signal time-axis expansion/compression method according to claim 1, wherein said window function is a sine window.

5. The audio-signal time-axis expansion/compression method according to claim 1, wherein with said correction-signal generating, the sign of said correction signal is inverted in the event that said correction signal and said cross-fade signal have a negative correlation.

6. The audio-signal time-axis expansion/compression method according to claim 5, wherein with said correction-signal generating, the amplitude of said correction signal is regulated such that the energy of said connection waveform serves as the middle of the energy of said first period signal and the energy of said second period signal.

7. An audio-signal time-axis expansion/compression device for subjecting an audio signal to time-axis expansion/compression at a time domain, said device comprising:

cross-fade signal generating means for generating, by employing a first period and a second period which are similar within said audio signal, the cross-fade signal of said first period signal and said second period signal;

correction signal generating means for generating a correction signal by subjecting the difference signal between said first period signal and said second period signal to time-axis reversal, and multiplying by a window function; and connection-waveform generating means for generating a connection waveform for subjecting said audio signal to time-axis expansion/compression at said time domain by adding said cross-fade signal and said correction signal.

8. The audio-signal time-axis expansion/compression device according to claim 7, wherein said connection waveform is inserted between said first period and said second period at the time of expanding said audio signal at a time domain, and is substituted with a period where said first period and said second period are overlapped at the time of compressing said audio signal at said time domain.

9. The audio-signal time-axis expansion/compression device according to claim 7 wherein said window function is a triangle window.

10. The audio-signal time-axis expansion/compression device according to claim 7, wherein said window function is a sine window.

11. The audio-signal time-axis expansion/compression device according to claim 7, wherein with said correction-signal generating means, the sign of said correction signal is inverted in the event that said correction signal and said cross-fade signal have a negative correlation.

12. The audio-signal time-axis expansion/compression device according to claim 11, wherein with said correction-signal generating means, the amplitude of said correction signal is regulated such that the energy of said connection waveform serves as the middle of the energy of said first period signal and the energy of said second period signal.

13. An audio-signal time-axis expansion/compression method for subjecting an audio signal to time-axis expansion/compression at a time domain, said method comprising the steps of:

sum-signal generating wherein a first period and a second period which are similar within said audio signal are employed to generate the sum signal of said first period signal and said second period signal;

correction-signal generating wherein the difference signal between said first period signal and said second period signal is subjected to time-axis reversal to generate a correction signal;

adding wherein said sum signal and said correction signal are added; and connection-waveform generating wherein the signal added at said adding is cross-faded with said first period signal and said second period signal to generate a connection waveform.

14. The audio-signal time-axis expansion/compression method according to claim 13, wherein said connection waveform is inserted between said first period and said second period at the time of expanding said audio signal at a time domain, and is substituted with a period where said first period and said second period are overlapped at the time of compressing said audio signal at said time domain.

15. An audio-signal time-axis expansion/compression device for subjecting an audio signal to time-axis expansion/compression at a time domain, said device comprising:

sum signal generating means for generating by employing a first period and a second period which are similar within said audio signal, the sum signal of said first period signal and said second period signal;

correction signal generating means for generating a correction signal by subjecting the difference signal between said first period signal and said second period signal to time-axis reversal;

adding means for adding said sum signal and said correction signal; and connection-waveform generating means for generating a connection waveform for subjecting said audio signal to time-axis expansion/compression at said time domain by cross-fading the signal added by said adding means with said first period signal and said second period signal.

16. The audio-signal time-axis expansion/compression device according to claim 15, wherein said connection waveform is inserted between said first period and said second period at the time of expanding said audio signal at a time domain, and is substituted with a period where said first period and said second period are overlapped at the time of compressing said audio signal at said time domain.

17. An audio-signal time-axis expansion/compression device for subjecting an audio signal to time-axis expansion/compression at a time domain, said device comprising:

a cross-fade signal generating unit for generating, by employing a first period and a second period which are similar within said audio signal, the cross-fade signal of said first period signal and said second period signal;

a correction signal generating unit for generating a correction signal by subjecting the difference signal between said first period signal and said second period signal to time-axis reversal, and multiplying by a window function; and a connection-waveform generating unit for generating a connection waveform for subjecting said audio signal to time-axis expansion/compression at said time domain by adding said cross-fade signal and said correction signal.

18. An audio-signal time-axis expansion/compression device for subjecting an audio signal to time-axis expansion/compression at a time domain, said device comprising:

a sum signal generating unit for generating by employing a first period and a second period which are similar within said audio signal, the sum signal of said first period signal and said second period signal;

a correction signal generating unit for generating a correction signal by subjecting the difference signal between said first period signal and said second period signal to time-axis reversal;

an adding unit for adding said sum signal and said correction signal; and a connection-waveform generating unit for generating a connection waveform for subjecting said audio signal to time-axis expansion/compression at said time domain by cross-fading the signal added by said adding unit with said first period signal and said second period signal.

* * * * *